United States Patent
Nagami

(10) Patent No.: US 9,428,947 B2
(45) Date of Patent: Aug. 30, 2016

(54) HINGE MECHANISM AND PANEL APPARATUS

(71) Applicant: Tetsuro Nagami, Tokyo (JP)

(72) Inventor: Tetsuro Nagami, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 35 days.

(21) Appl. No.: 14/422,830

(22) PCT Filed: Dec. 4, 2012

(86) PCT No.: PCT/JP2012/081352
§ 371 (c)(1),
(2) Date: Feb. 20, 2015

(87) PCT Pub. No.: WO2014/087477
PCT Pub. Date: Jun. 12, 2014

(65) Prior Publication Data
US 2015/0240544 A1  Aug. 27, 2015

(51) Int. Cl.
| | |
|---|---|
| *E05D 11/10* | (2006.01) |
| *E05D 11/08* | (2006.01) |
| *F16M 11/10* | (2006.01) |
| *B60N 3/00* | (2006.01) |
| *B60R 11/02* | (2006.01) |
| *F16M 13/02* | (2006.01) |

(Continued)

(52) U.S. Cl.
CPC ............. *E05D 11/082* (2013.01); *B60N 3/004* (2013.01); *B60R 11/0235* (2013.01); *F16M 11/10* (2013.01); *F16M 13/02* (2013.01); *H05K 5/0017* (2013.01); *H05K 5/0226* (2013.01); *B60R 2011/0015* (2013.01); *B60R 2011/0082* (2013.01); *B60R 2011/0085* (2013.01); *E05D 2011/085* (2013.01); *Y10T 16/54028* (2015.01)

(58) Field of Classification Search
CPC ............... E05D 11/082; E05D 11/084; E05D 11/1042; E05D 11/10; E05D 2011/1035; B60N 3/001; B60N 3/004; Y10T 16/54028
USPC ......... 16/277, 312, 315, 317, 319, 321, 334, 16/335, 341
See application file for complete search history.

(56) References Cited

U.S. PATENT DOCUMENTS

| | | | |
|---|---|---|---|
| 6,421,878 B1 | 7/2002 | Kaneko et al. | |
| 6,711,780 B2 * | 3/2004 | Lee | ........................... E06C 1/32 16/326 |

(Continued)

FOREIGN PATENT DOCUMENTS

| | | |
|---|---|---|
| JP | 2000-55031 A | 2/2000 |
| JP | 2001-32823 A | 2/2001 |

(Continued)

*Primary Examiner* — Roberta Delisle
(74) *Attorney, Agent, or Firm* — Birch, Stewart, Kolasch & Birch, LLP

(57) ABSTRACT

In a state where a panel unit 53 is held at a storing angle with a projecting portion 15 of a click plate 13 fitted in a recessed portion 10 of a bracket 7, the back side of the projecting portion 15 and a pressing piece 20 of a friction plate 18 do not abut on each other, so that only a reaction force of the click plate 13 serves as a resistance. When the panel unit 53 starts turning, the projecting portion 15 abuts on the pressing piece 20 through the elastic deformation at the time when the projecting portion 15 moves out of the recessed portion 10 to get onto a sliding surface 9, so that a sliding resistance is obtained from the reaction forces of the click plate 13 and the friction plate 18 after abutment.

10 Claims, 18 Drawing Sheets

(51) Int. Cl.
  *H05K 5/00* (2006.01)
  *H05K 5/02* (2006.01)
  *B60R 11/00* (2006.01)

(56) References Cited

U.S. PATENT DOCUMENTS

| | | | | |
|---|---|---|---|---|
| 7,146,684 | B2 * | 12/2006 | Hirtsiefer | E05C 17/345 16/319 |
| 7,870,644 | B2 * | 1/2011 | Chang | G06F 1/1616 16/303 |
| 7,975,350 | B2 * | 7/2011 | Nagami | B60R 11/0235 16/334 |
| 8,307,507 | B2 * | 11/2012 | Wang | E05D 11/06 16/334 |
| 8,429,796 | B2 * | 4/2013 | Nagami | B60R 11/0235 16/334 |
| 2008/0047104 | A1 * | 2/2008 | Chien | E05D 11/10 16/334 |
| 2008/0256748 | A1 | 10/2008 | Saito et al. | |
| 2009/0070958 | A1 * | 3/2009 | Chien | H04M 1/0216 16/266 |
| 2009/0224583 | A1 * | 9/2009 | Nagura | B60N 2/2356 297/302.6 |
| 2011/0047749 | A1 * | 3/2011 | Chang | E05F 1/16 16/297 |
| 2011/0072616 | A1 * | 3/2011 | Lin | G06F 1/1681 16/297 |
| 2011/0075335 | A1 * | 3/2011 | Nagami | B60R 11/0235 361/679.01 |
| 2011/0146029 | A1 * | 6/2011 | Nagami | B60R 11/0235 16/366 |
| 2011/0239405 | A1 * | 10/2011 | Nagami | F16C 11/10 16/277 |
| 2012/0036680 | A1 * | 2/2012 | Nagami | B60R 11/0235 16/297 |

FOREIGN PATENT DOCUMENTS

| | | |
|---|---|---|
| JP | 2001-107941 A | 4/2001 |
| JP | 2006-105275 A | 4/2006 |
| WO | WO 2006/035757 A1 | 4/2006 |

* cited by examiner

A-A (a)

(b)

$F = M1 \times \tan\theta + M1 \times \cos\theta \times \mu1 \fallingdotseq F1$

B-B (c)

B1-B1

(a)

(b)

$F = \mu 2 \times M2$

B-B (c)

B1-B1

(a)

(b)

C-C (c)

C1-C1

(a)

(b)

D-D

E-E (a)

(b)

F-F (c)

G-G (a)

(b)

H-H (c)

I-I

HINGE MECHANISM AND PANEL APPARATUS

TECHNICAL FIELD

The present invention relates to a hinge mechanism that holds a turning member at an arbitrary angle with respect to a fixed member, and to a panel apparatus that uses the hinge mechanism to hold a panel unit at an arbitrary angle with respect to a main body unit.

BACKGROUND ART

As a hinge mechanism that turns a panel unit having a monitor to hold the panel unit at an arbitrary angle with respect to a main body unit, there is provided a tilt hinge described in Patent Document 1, for example. The tilt hinge is composed of: a mounting member having a bearing plate portion; a rotary shaft rotatably journaled in a bearing hole provided in the bearing plate portion; a first friction plate and a first friction washer interposed between one side surface of the bearing plate portion and a large diameter portion of the rotary shaft, and provided with inserted thereinto by the rotary shaft; a second friction plate and a second friction washer contacting the other side surface of the bearing plate portion and provided with inserted thereinto by the rotary shaft; a fixed washer contacting the second friction washer to rotate in synchronization with the rotary shaft; a spring washer contacting the fixed washer and provided with inserted thereinto by the rotary shaft; a pushing washer contacting the spring washer and provided with inserted thereinto by the rotary shaft; and a caulked portion formed by caulking an end portion of the rotary shaft projecting from the pushing washer, whereby it is configured such that the mounting member and the rotary shaft relatively rotate only when specific rotational torque is applied thereto.

Therefore, a friction plate and a friction washer in a disk shape are held, while the rotary shaft is inserted thereinto, between one side of the mounting member and the large diameter portion of the rotary shaft, and between the other side of the mounting member and the pushing washer to bring the friction plate and the friction washer into press contact with each other, whereby it is configured such that friction torque (a friction force) in the thrust direction (axial direction) is generated between the friction plate and the friction washer when the rotary shaft is rotated. The action of the friction torque in the thrust direction allows the rotary shaft to be held at an arbitrary position with respect to the mounting member when the rotary shaft is rotated.

Thus, in the tilt hinge according to Patent Document 1, constant torque is provided at any rotational angle, and torque may not be increased or decreased in accordance with the angle.

For a hinge mechanism for use in an in-vehicle panel apparatus, a large holding force is required at a storing position such that a panel unit having a monitor is not opened from the storing position on the side of a main body unit even when vibration occurs, and a click feeling is desired to see the panel unit at the storing position.

Accordingly, a turning mounting mechanism described in Patent Document 1, for example, is composed of: a base member provided with an insertion hole; a turning shaft rotatably pivoted about the axial center; a click plate fixed to the rotary shaft and provided with a recessed portion for a click function formed in a surface facing one surface of the base member; and a click spring fixed to the base member to be brought into press contact with the click plate and provided with a projecting portion for a click function to be fitted into the recessed portion of the click plate, whereby it is configured such that the projecting portion of the click spring is fitted into and moved out of the recessed portion of the click plate to thus generate a click action.

Therefore, the elastic force of the click spring acts as an urging force that brings the members into press contact with each other, and the friction force generated by the urging force acts to hold the panel unit in a stop state at an arbitrary angle. In addition, when the projecting portion of the click spring is fitted in the recessed portion of the click plate, the panel unit can be held to prevent the opening from the storing position. Further, a click feeling can be felt when the projecting portion of the click spring is fitted into and moved out of the recessed portion of the click plate to suitably inform a viewer of the storing position of the panel unit.

CITATION LIST

Patent Document

Patent Document 1: Japanese Patent Application Laid-open No. 2001-107941
Patent Document 2: Japanese Patent Application Laid-open No. 2000-55031

SUMMARY OF THE INVENTION

Problems to be Solved by the Invention

The conventional hinge mechanism is configured as described above. Thus, as described in Patent Document 2, in a case where the click function is provided only at the storing position of the panel unit, and it is attempted to turn the panel unit by an arbitrary angle from the storing position and hold the panel unit by only a friction force, a panel unit holding force T1 at this time is calculated as T1=μ1 (coefficient of static friction)×M (spring load)×L (distance in the radial direction from the rotation center of the click spring to the projecting portion for the click function), and a holding force T2 of the click function at the storing position is determined as T1<T2 because a force to cause the projecting portion of the click spring to get onto a surface of the click plate from the recessed portion of the click plate becomes necessary.

There is a problem such that the holding force T2 of the click function is several times the panel unit holding force T1 at an arbitrary angle, and thus the operating force at the time of a click may be so large as to degrade the operability. In addition, there is a problem such that the contact pressure (pushing force) applied from the projecting portion of the click spring to the recessed portion of the click plate may be so large as to generate uneven wear if the projecting portion of the click spring repeatedly operates to move out of the recessed portion of the click plate.

On the other hand, in order to suppress degradation in operability and generation of uneven wear, it is assumed that the panel unit holding force T1 is reduced by reducing the holding force T2 of the click function; for example, in a seat back monitor in which the panel unit is mounted openably and closably to a back surface of a reclinable in-vehicle seat with the conventional hinge mechanism, in a case where the panel unit is opened in the direction opposite to the gravity direction and held by the friction force, the panel unit occasionally falls in the direction of the center of gravity of the panel unit (direction of the viewer) because of external vibration or the like if the center of gravity is positioned further toward the viewer side than the center of the rotation.

The present invention has been made to solve the foregoing problems, and therefore an object of the invention is to provide a hinge mechanism and a panel apparatus that generate a small sliding resistance at the start of turning from the storing position and that generate a large sliding resistance during turning.

Means for Solving the Problems

The present invention provides a hinge mechanism that turnably couples a fixed member and a turning member to each other, and that holds the turning member at a predetermined first angle with respect to the fixed member, and that turns the turning member from the first angle to hold the turning member at an arbitrary second angle, the hinge mechanism including: a support shaft fixed to the turning member; a fixed portion fixed to the fixed member to rotatably support the support shaft, the fixed portion including a recessed portion provided in one side surface at a position corresponding to the first angle; an elastically deformable click plate that turns integrally with the support shaft and that includes a projecting portion to be brought into press contact with the one side surface of the fixed portion to generate a sliding resistance, and fitted in and detached from the recessed portion; and an elastically deformable friction plate that turns integrally with the support shaft and the click plate, and that is provided with a pressing portion that applies a pressing force to aback side of the projecting portion of the click plate, and it is configured that the pressing portion of the friction plate does not abut on the back side of the projecting portion at the first angle at which the projecting portion of the click plate is fitted into the recessed portion of the fixed portion, and abuts on the back side of the projecting portion which has been elastically deformed to generate the pressing force at an angle other than the first angle.

The present invention also provides a panel apparatus that uses a hinge mechanism to turnably couple a main body unit and a panel unit having a monitor screen to each other, the monitor screen being held at a first angle at which the monitor screen is closed to the main body unit side when not in use, and held at an arbitrary second angle at which the panel unit is turned from the first angle to open the monitor screen when in use, and the hinge mechanism includes: a support shaft fixed to the panel unit; a fixed portion fixed to the main body unit to rotatably support the support shaft, the fixed portion including a recessed portion provided in one side surface at a position corresponding to the first angle; an elastically deformable click plate that turns integrally with the support shaft, and that includes a projecting portion to be brought into press contact with the one side surface of the fixed portion to generate a sliding resistance, and fitted in and detached from the recessed portion; and an elastically deformable friction plate that turns integrally with the support shaft and the click plate, and that is provided with a pressing portion that applies a pressing force to a back side of the projecting portion of the click plate, and the pressing portion of the friction plate does not abut on the back side of the projecting portion at the first angle at which the projecting portion of the click plate is fitted into the recessed portion of the fixed portion, and abuts on the back side of the projecting portion which has been elastically deformed to generate the pressing force at an angle other than the first angle.

Effect of the Invention

According to the present invention, in a state where the turning member is held at the first angle with the projecting portion of the click plate fitted in the recessed portion of the fixed portion, the back side of the projecting portion and the pressing portion of the friction plate do not abut on each other, so that only the reaction force of the click plate serves as a resistance; when the turning member starts turning, the back side of the projecting portion abuts on the pressing portion to generate the pressing force through the elastic deformation at the time the projecting portion moves out of the recessed portion to get onto one side surface of the fixed portion; the sliding resistance is obtained from the reaction forces of the click plate and the friction plate after abutment; thus, it is possible to provide a hinge mechanism that generates a small sliding resistance at the start of turning from the storing position and that generates a large sliding resistance during turning, and to provide a panel apparatus that uses the hinge mechanism.

MODES FOR CARRYING OUT THE INVENTION

In the following, in order to describe the present invention in more detail, embodiments for carrying out the invention will be described with reference to the accompanying drawings.

EMBODIMENT 1

Figure 1:
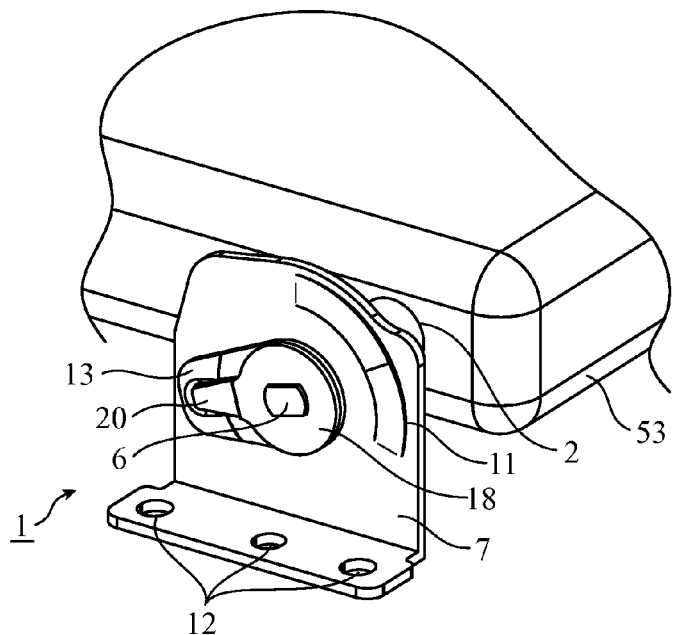
FIG. 1 is an appearance perspective view illustrating a configuration of a hinge mechanism according to Embodiment 1 of the present invention.
Figure 2:
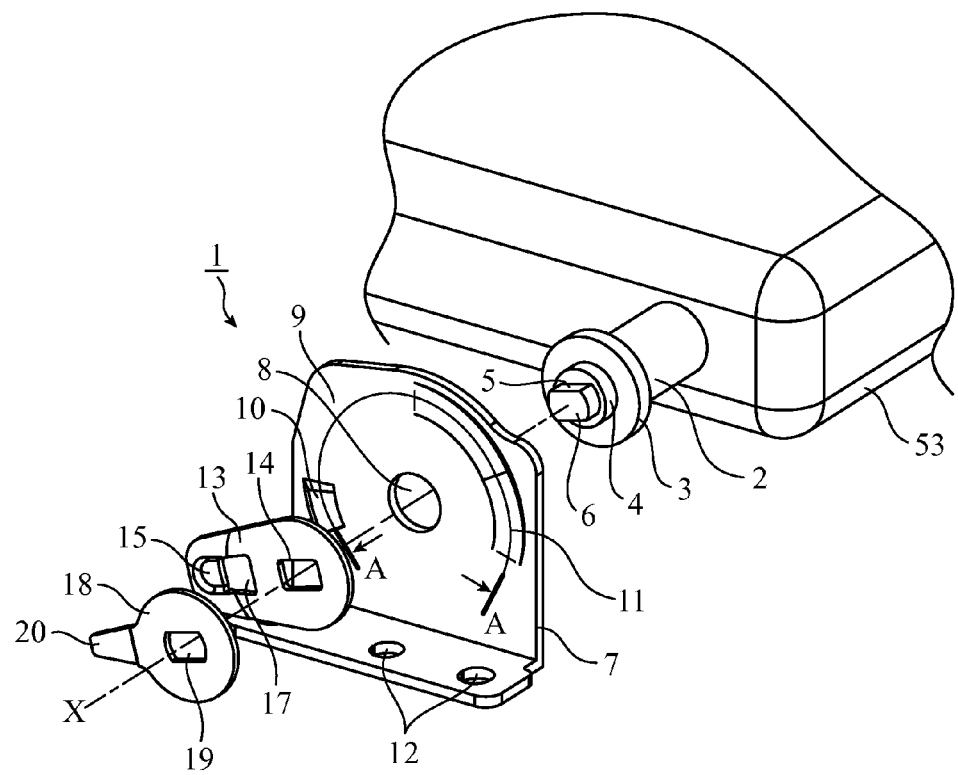
FIG. 2 is an exploded perspective view illustrating the configuration of the hinge mechanism according to Embodiment 1.
Figure 3:
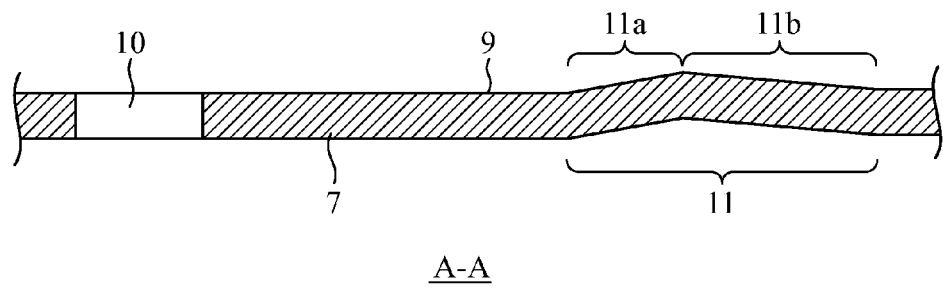
FIG. 3 is a sectional view of a bracket of the hinge mechanism according to Embodiment 1 taken along a line A-A of FIG. 2.
Figure 4:
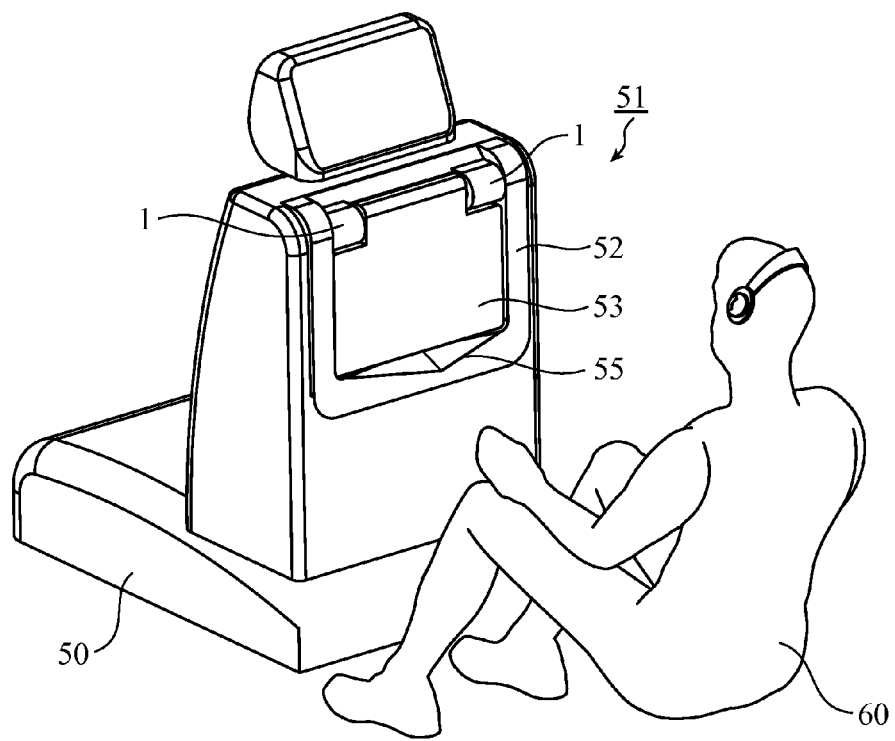
FIG. 4 is an appearance perspective view illustrating a seat back monitor apparatus in a storing state to which the hinge mechanisms according to Embodiment 1 are applied.
Figure 5:
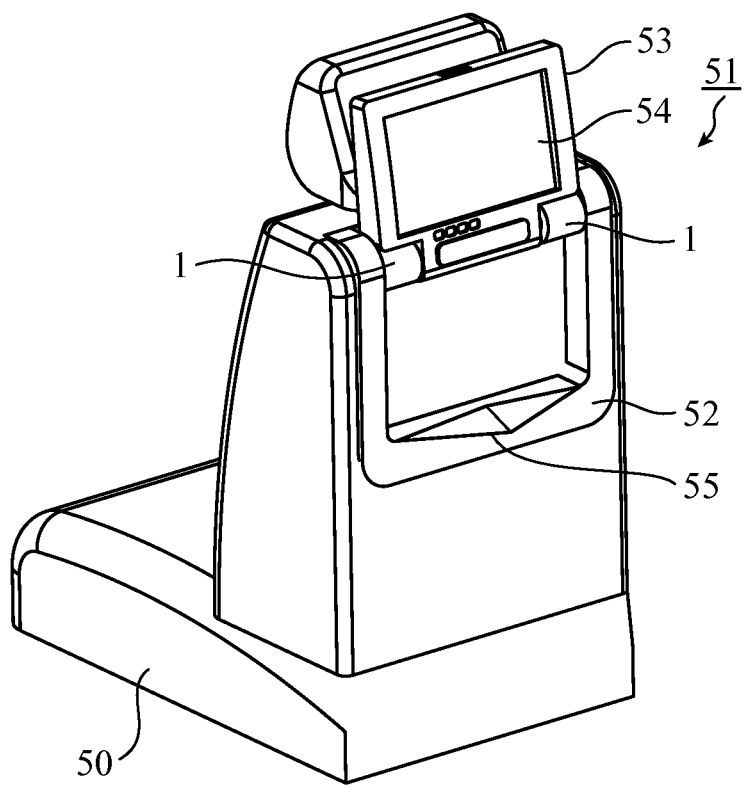
FIG. 5 is an appearance perspective view illustrating the seat back monitor apparatus in a viewing state to which the hinge mechanisms according to Embodiment 1 are applied.

FIGS. 1 and 2 are an appearance perspective view and an exploded perspective view, respectively, illustrating a configuration of a hinge mechanism 1 according to Embodiment 1. FIG. 3 is a sectional view of a bracket (fixed portion) 7 taken along a line A-A of FIG. 2. In Embodiment 1, in addition, the hinge mechanisms 1 are applied to an in-vehicle seat back monitor apparatus (panel apparatus). FIG. 4 illustrates a state in which a panel unit (turning member) 53 of a seat back monitor apparatus 51 to which the hinge mechanisms 1 are applied is stored within a main body unit (fixed member) 52. FIG. 5 illustrates a state in which the panel unit 53 is turned to a viewing position and held.

As illustrated in FIGS. 4 and 5, the seat back monitor apparatus 51 is provided on the back surface of a reclinable seat 50 such as a driver's seat and a passenger's seat of an automobile. The seat back monitor apparatus 51 is composed of a main body unit 52, a pair of hinge mechanisms 1 fixed to an upper end portion of the main body unit 52, and a panel unit 53 that is turnably coupled with respect to the main body unit 52 by the pair of hinge mechanisms 1, and that is turned in a direction opposite to a gravity direction from a state stored in the main body unit 52 to open a monitor screen 54, resulting in a state suitable for viewing.

Figure 6:
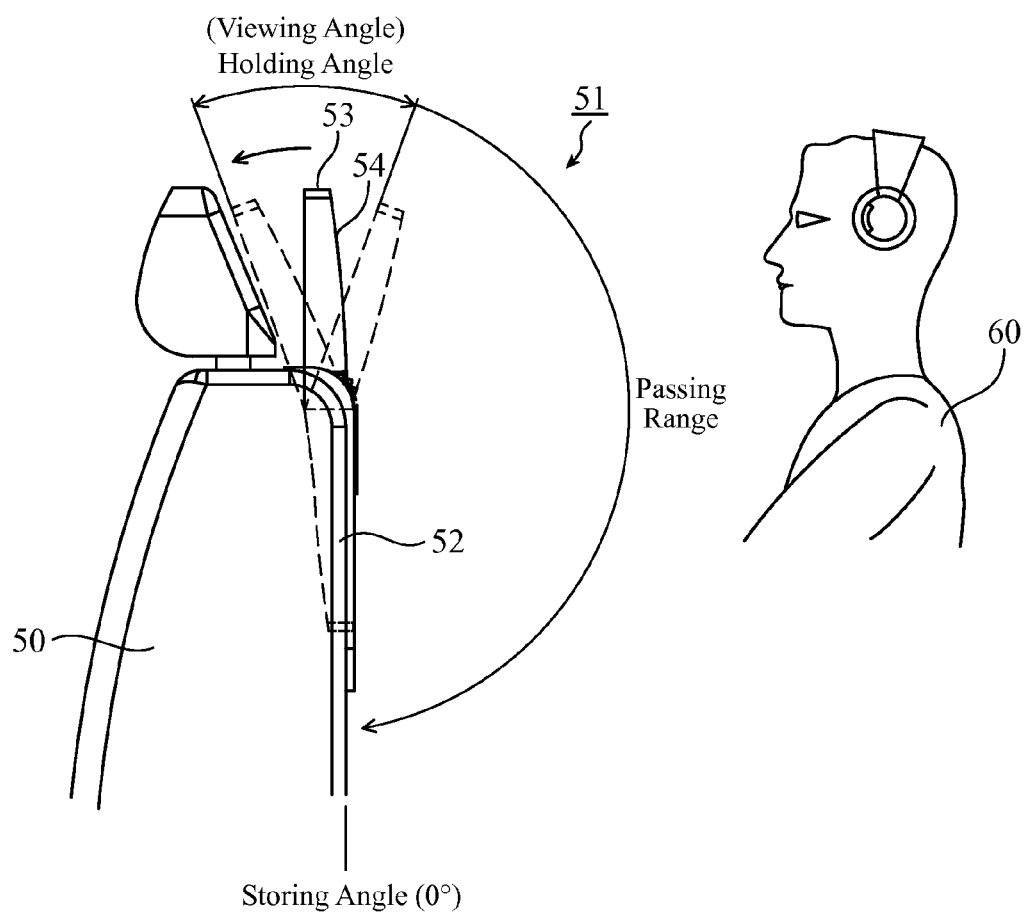
FIG. 6 is a diagram illustrating a positional relationship between a turning angle of a panel unit and a viewer in Embodiment 1.

FIG. 6 is a diagram illustrating a positional relationship between a turning angle of the panel unit 53 and a viewer 60. In the following description, the angle at which the panel unit 53 is stored within the main body unit 52, that is, the angle at which the turning angle of the panel unit 53 is 0°, is referred to as a storing angle (first angle). Meanwhile, the angle range in which the panel unit 53 is suitable for viewing is referred to as a holding angle (second angle). The viewer 60 turns the panel unit 53 to an arbitrary viewing angle within the holding angle range. Incidentally, in the example of FIG. 6, the panel unit 53 is held at the viewing angle at which the panel unit 53 is turned by 180° from the storing angle 0°; however, the viewer 60 can turn the panel unit 53 to an angle equal to or more than 180° or equal to or less than 180° in the holding angle range in accordance with a reclined angle of the seat 50.

As illustrated in FIGS. 1 and 2, the hinge mechanism 1 according to the present Embodiment 1 includes a shaft (support shaft) 2 fixed to the panel unit 53, a bracket 7 fixed to the main body unit 52, a click plate 13 that generates a click action, and a friction plate 18 that applies a pressing force to the click plate 13, and the shaft 2 rotates about a rotational axis X integrally with the click plate 13 and the friction plate 18.

In the following description, the side closer to the panel unit 53 along the rotational axis X is referred to as an inner side, and the side farther from the panel unit 53 is referred to as an outer side.

As illustrated in FIG. 2, a rotational shaft hole 8 for rotatably supporting the shaft 2 inserted thereinto is formed in the bracket 7. In addition, a circumferential portion of a surface of the bracket 7 facing the click plate 13 about the rotational axis X is defined as a sliding surface 9; a recessed portion 10 is formed in a portion of the sliding surface 9 corresponding to the storing angle of the panel unit 53, while a downslope tapered portion 11b is formed at a portion of the sliding surface 9 corresponding to the holding angle. The downslope tapered portion 11b is formed as an inclined surface that gently descends in an opening direction of the panel unit 53, and an inclined surface (upslope tapered portion 11a) that gently ascends in the opening direction is formed in a front side of the downslope tapered portion 11b, thus providing a mountain-shaped holding projecting portion 11 that projects toward the click plate 13. The bracket 7 is fixed to the main body unit 52 with screws (not shown in the figures) passed through screw holes 12.

One end of the shaft 2 is provided with a flange portion 3 with a diameter that is larger than a hole diameter of the rotational shaft hole 8 of the bracket 7, a medium diameter portion 4 provided in a distal end direction of the flange portion 3 and having a diameter that is slightly smaller than the hole diameter of the rotational shaft hole 8 and a length that is slightly larger than a thickness of the bracket 7, and a small diameter portion 6 having a diameter that is smaller than that of the medium diameter portion 4 and two sides of a plane cut portion 5 at a distal end portion of the medium diameter portion 4. Meanwhile, the other end of the shaft 2 is fixed to the panel unit 53.

The medium diameter portion 4 of the shaft 2 is inserted into the rotational shaft hole 8 of the bracket 7. In addition, the small diameter portion 6 of the shaft 2 is inserted into the click plate 13 provided with a shaft fitting hole 14 that is slightly larger than the outer shape of the small diameter portion 6, and the friction plate 18 provided with a caulking hole 19 that is also slightly larger than the outer shape of the small diameter portion 6. Then, by caulking the distal end of the small diameter portion 6, the shaft 2, the bracket 7, the click plate 13, and the friction plate 18 are integrated with each other, so that the bracket 7 turnably supports the shaft 2, and that the click plate 13 and the friction plate 18 are turnable integrally with the shaft 2.

Note that the length of the small diameter portion 6 in the direction of the rotational axis X is set to the sum of a plate thickness of the click plate 13, a plate thickness of the friction plate 18, and a length required for caulking fixation (an amount to be deformed by caulking and an amount that remains uncaulked).

A surface of the click plate 13 of a metal elastic body facing the bracket 7 is provided with a projecting portion 15 that presses the sliding surface 9 of the bracket 7 to generate a sliding resistance during turning, and a surface opposite to the projecting portion 15 is dented. The projecting portion 15 is fitted into the recessed portion 10 of the bracket 7 when the panel unit 53 is at the storing angle, and slides from the sliding surface 9 to the holding projecting portion 11 as the panel unit 53 is turned. In addition, an opening 17 is formed on a radially inner side of the projecting portion 15, and it is thus configured such that the projecting portion 15 is elastically deformed to be displaceable in the direction of the rotational axis X.

The friction plate 18 of a metal elastic body has a generally circular shape, and a projecting pressing piece (pressing portion) 20 that is elastically deformable is formed at its outer peripheral portion. The friction plate 18 and the click plate 13 turn integrally with each other with the pressing piece 20 of the friction plate 18 fitted in the back side of the projecting portion 15 of the click plate 13. The pressing piece 20 abuts on the back side of the projecting portion 15 to be elastically deformed, thus generating a pressing force against the click plate 13.

Although discussed in detail later, a gap 16 (illustrated in FIG. 7 to be described later) is provided between the back side of the projecting portion 15 and the pressing piece 20 in a state that each of the click plate 13 and the friction plate 18 is not elastically deformed.

Next, an operation of the hinge mechanism 1 will be described with reference to FIGS. 7 to 10 taking an example in which the hinge mechanisms 1 are incorporated in the in-vehicle seat back monitor apparatus 51.

FIG. 7(a) is a perspective view of the hinge mechanism 1 with the panel unit 53 at the storing angle, FIG. 7(b) is a sectional view taken along a line B-B, and FIG. 7(c) is a sectional view taken along a line B1-B1. FIG. 8(a) is a perspective view of the hinge mechanism 1 in the course in which the panel unit 53 is turned from the storing angle to the holding angle (viewing angle), and FIGS. 8(b) and 8(c) are sectional views at the corresponding moment. FIG. 9(a) is a perspective view of the hinge mechanism 1 with the panel unit 53 at the holding angle (viewing angle), FIG. 9(b) is a sectional view taken along a line C-C, and FIG. 9(c) is a sectional view taken along a line C1-C1. FIG. 10(a) is a graph illustrating a relationship between the turning angle of the panel unit 53 and an operating force, and an angle range at the start of turning is enlarged and illustrated in FIG. 10(b). In FIG. 10, the vertical axis indicates the operating force required to turn the panel unit 53, and the horizontal axis indicates the turning angle of the panel unit 53.

Figure 7:
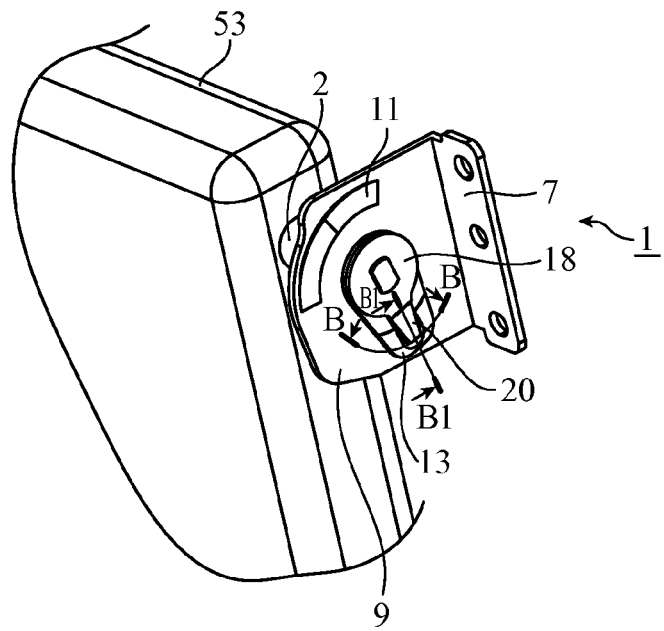
FIG. 7 is a diagram illustrating an operation of the hinge mechanism according to Embodiment 1, illustrating the panel unit at a storing angle.
Figure 7:
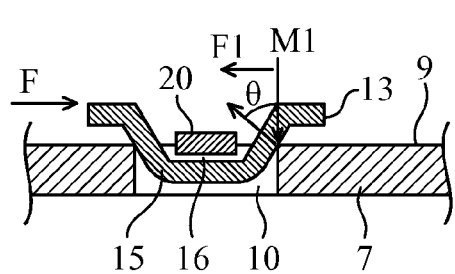
Figure 7:
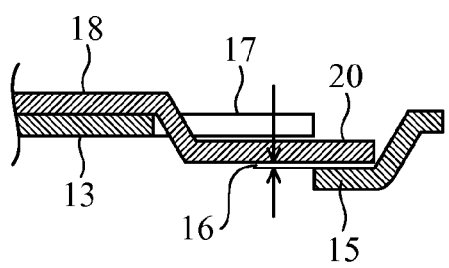

At the storing angle, the projecting portion 15 of the click plate 13 is in a state fitted into the recessed portion 10 of the bracket 7 as illustrated in FIG. 7, and the panel unit 53 is held by fitting between the projecting portion 15 and the recessed portion 10. In this state, as illustrated in FIG. 7(a), the pressing piece 20 of the friction plate 18 is fitted in a dent on the back side of the projecting portion 15 of the click plate 13, but does not abut on the projecting portion 15, thus forming the gap 16. In the illustrated example, the pressing piece 20 is formed by bending the outer peripheral portion of the friction plate 18, and thus, it is adapted that the pressing piece 20 is accommodated in the dent on the back side of the projecting portion 15 to thereby prevent a projection from the dent, and also that the gap 16 is generated between the back side of the projecting portion 15 and the pressing piece 20.

Since the gap 16 is generated between the projecting portion 15 and the pressing piece 20, a holding force F1 of a click function (which is approximately equal to an operating force F required to turn the shaft 2) due to the fitting between the projecting portion 15 and the recessed portion 10 is determined by a spring load M1 of the click plate 13, an angle θ of a stepped portion of the projecting portion 15, and a coefficient of static friction μl.

Next, when desiring to see a video, the viewer 60 inserts his/her finger into a panel holding recessed portion 55 provided in the main body unit 52 illustrated in FIG. 4 and located at the distal end of the screen with the panel unit 53 closed, and catches the distal end portion of the panel unit 53 to manually turn the panel unit 53, in order to open the panel unit 53 which has been stored within the main body unit 52 to an angle at which the panel unit 53 is easily viewable.

Figure 8:
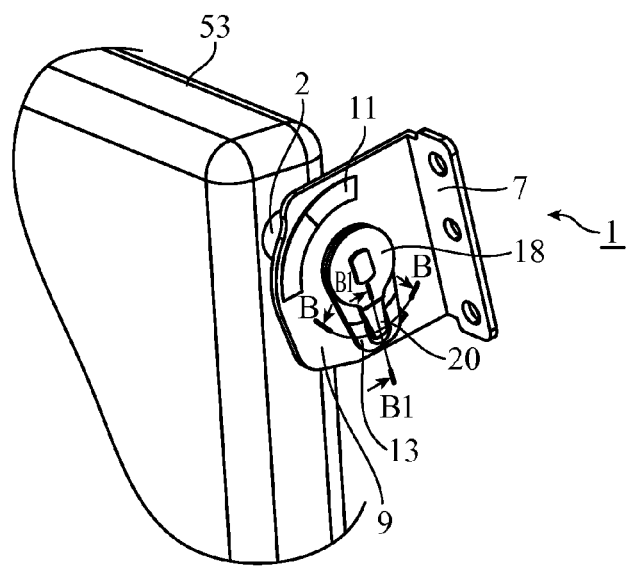
FIG. 8 is a diagram illustrating the operation of the hinge mechanism according to Embodiment 1, illustrating the panel unit in a turning state.
Figure 8:
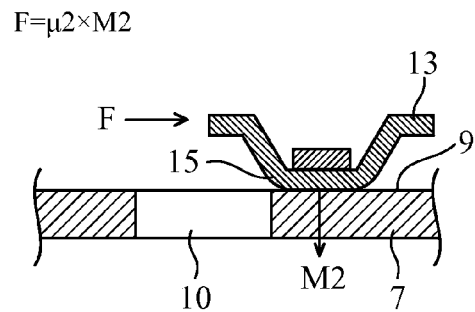
Figure 8:
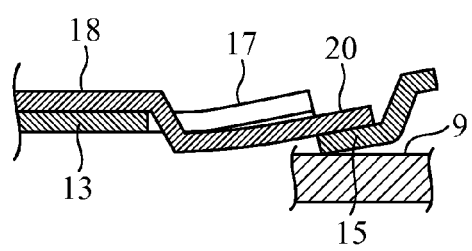

Then, in the hinge mechanism 1, the projecting portion 15 moves out of the recessed portion 10 of the bracket 7 when the click plate 13 is elastically deformed as illustrated in FIG. 8, and gets onto the sliding surface 9. At this time, a displacement of the projecting portion 15 causes the pressing piece 20 of the friction plate 18 to abut on the back side thereof to thereby lift the pressing piece, before the projecting portion 15 moves out of the recessed portion 10. Therefore, the sliding resistance is obtained by the reaction forces of the click plate 13 and the friction plate 18 after the abutment, and the operating force becomes maximum immediately before the projecting portion 15 escapes the recessed portion 10 as indicated by a solid line in a graph of FIG. 10(b), so that a click feeling is generated. It should be noted that the operating force F in the escape is determined by a spring load M2 obtained by adding the elastic force of the click plate 13 and the pressing force applied by the pressing piece 20 to the click plate 13 and a coefficient of kinetic friction μ2 (μ2<μ1).

Figure 9:
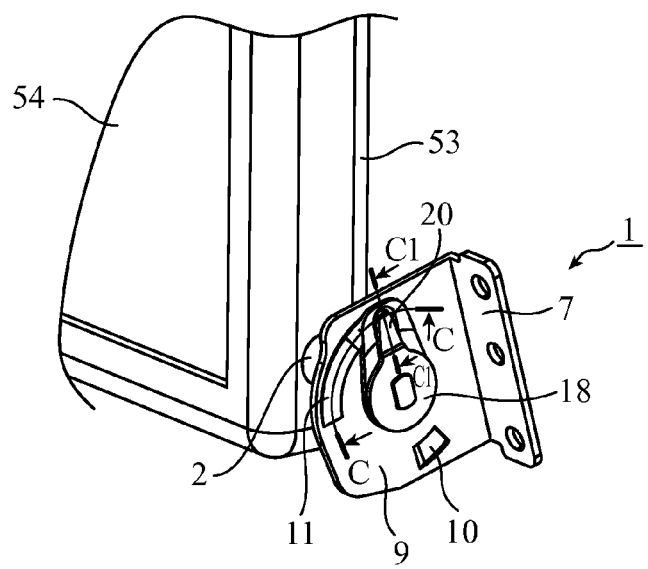
FIG. 9 is a diagram illustrating the operation of the hinge mechanism according to Embodiment 1, illustrating the panel unit at a holding angle (viewing angle).
Figure 9:
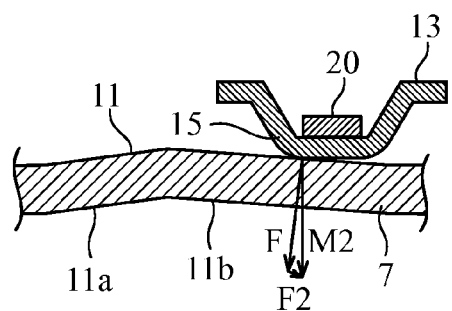
Figure 9:
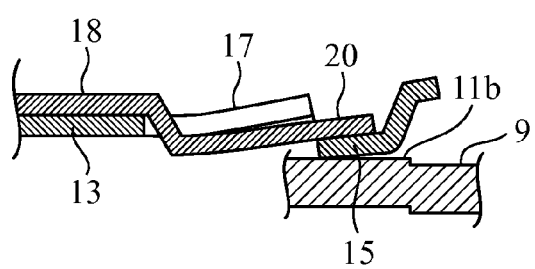
Figure 10:
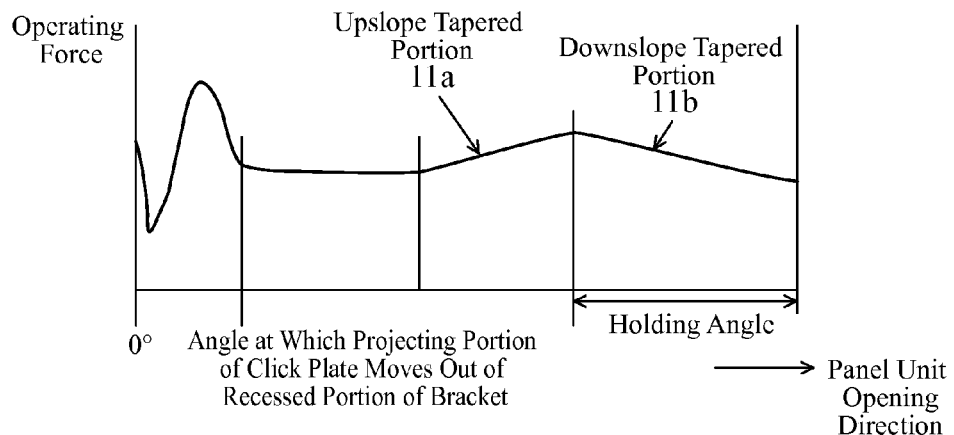
FIG. 10 is a graph illustrating a relationship between the turning angle of the panel unit and an operating force in Embodiment 1.
Figure 10:
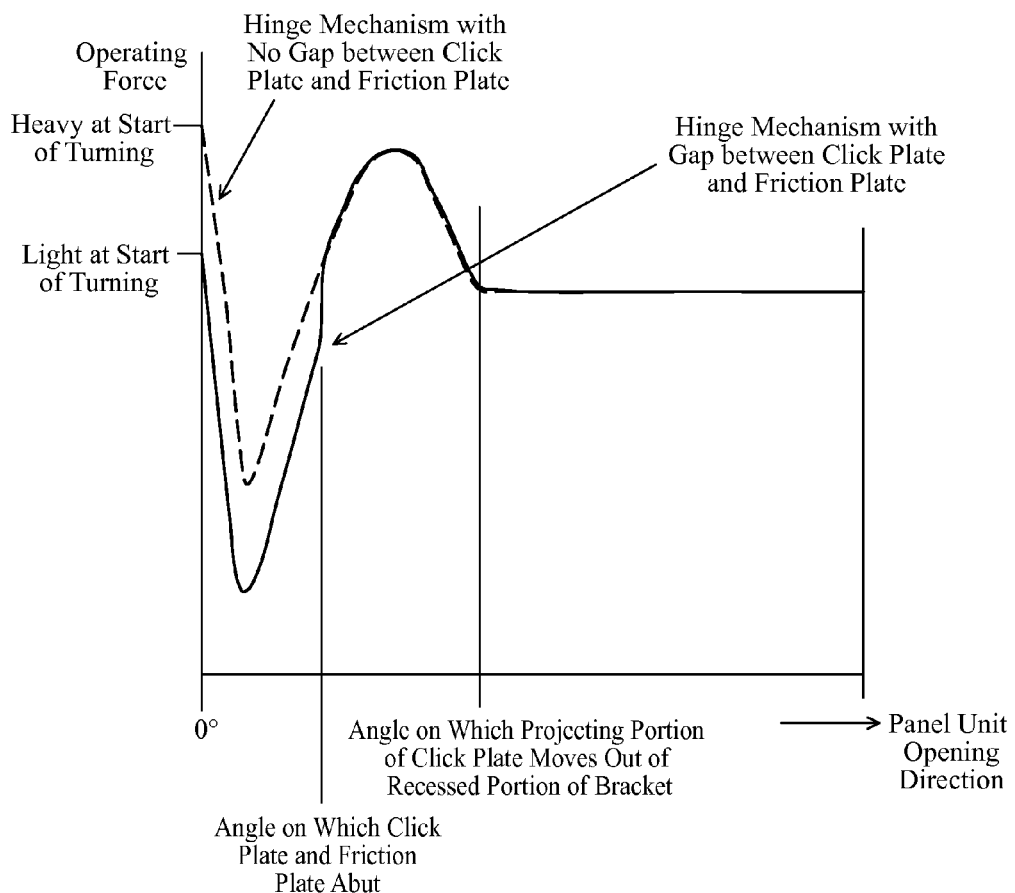

In a case where the following state is set: the viewer 60 further turns the panel unit 53 to direct the monitor screen 54 to the viewer 60 at the viewing angle as illustrated in FIG. 5, the click plate 13, to which the pressing force of the pressing piece 20 is applied, slides on the downslope tapered portion 11b as illustrated in FIG. 9 to be further elastically deformed than a moment sliding on the sliding surface 9 as illustrated in FIG. 8, and a larger sliding resistance is obtained. Hence, the panel unit 53 can be held at the viewing angle with a holding force that is larger than the operating force at the time when the click plate 13 slides on the sliding surface 9. Consequently, the viewer 60 can turn the panel unit 53 within the holding angle range in accordance with the reclining angle of the seat 50 to adjust the panel unit at an easily viewable angle.

When the panel unit 53 is at an arbitrary viewing angle within the holding angle range, that is, when the projecting portion 15 of the click plate 13 is on the downslope tapered portion 11b of the bracket 7, a holding force sufficient to prevent a fall of the panel unit 53 at the viewing angle is required for the hinge mechanism 1.

Here, a force FO with which the panel unit 53 is turned by its own weight is determined as (weight of panel unit 53)×(distance from rotational axis X to center of gravity of panel unit 53). On the other hand, the holding force F of the hinge mechanism 1 is determined as μ (coefficient of friction)×M (spring load)×L (distance in radial direction from rotational axis X to projecting portion 15 for click function).

Then, in order to obtain the holding force sufficient to prevent the fall of the panel unit 53 at the viewing angle, it is necessary that F>F0 be established.

However, if the holding force at the viewing angle is increased, in order to turn the panel unit 53 from the storing angle, a force that is several times F is required to move the projecting portion 15 of the click plate 13 out of the recessed portion 10 of the bracket 7, which degrades the operability.

Accordingly, in the present Embodiment 1, when the panel unit 53 is at the storing angle, the gap 16 is formed with the pressing piece 20 not abutting on the back side of the projecting portion 15 as illustrated in FIG. 7, and only the click plate 13 is elastically deformed so that only the reaction force of the click plate 13 is used as the spring load M during generation of static friction with a large coefficient of friction μ at the start of movement. Therefore, the click operating force is reduced to thus provide good operability. In addition, the reduced click operation force can suppress uneven wear due to the projecting portion 15 sliding on a stepped portion of the recessed portion 10.

Since the start of the movement, the click plate 13 is further elastically deformed as illustrated in FIG. 8, and the back side of the projecting portion 15 abuts on the pressing piece 20 to increase the spring load M, while because kinetic friction with a small coefficient of friction μ is generated during turning operation, the holding force F is not increased. Hence, the operating force is also not increased to prevent degradation of the operability.

Meanwhile, when the panel unit 53 is at the holding angle which is the viewing angle, the back side of the projecting portion 15 of the click plate 13 and the pressing piece 20 of the friction plate 18 abut on each other as illustrated in FIG. 9 to be in a mutually elastically deformed state; therefore, a large holding force F is obtained from the spring load M obtained by adding the elastic force of the click plate 13 to the elastic force of the friction plate 18, and the coefficient of static friction μ1. Consequently, a holding force that is not excessively large at the storing angle can be achieved with obtaining the large holding force at the holding angle.

In a case where it is configured that the back side of the projecting portion 15 of the click plate 13 and the pressing piece 20 of the friction plate 18 abut on each other with no gap 16 provided between the back side of the projecting portion 15 and the pressing piece 20 unlike the hinge mechanism 1 according to Embodiment 1, the reaction forces of the click plate 13 and the friction plate 18 are generated since the start of turning as indicated by a broken line in FIG. 10(*b*), and therefore a large operating force is required to degrade the operability. In addition, the contact pressure at the time when the projecting portion 15 moves out of the recessed portion 10 is high, and therefore the projecting portion 15 is unevenly worn.

Additionally, in the present Embodiment 1, the gap 16 is provided between the back side of the projecting portion 15 and the pressing piece 20, and therefore the amount of deflection of the friction plate 18 is smaller than the amount of deflection of the click plate 13 when the projecting portion 15 abuts on the sliding surface 9; thus, the reaction force of the friction plate 18 is smaller than the reaction force of the click plate 13 if the friction plate 18 and the click plate 13 have the same spring constant. Accordingly, the click plate 13 and the friction plate 18 may be shaped such that the spring constant of the friction plate 18 is larger than the spring constant of the click plate 13 to make the distance of elastic deformation of the friction plate 18 shorter than the distance of elastic deformation of the click plate 13; thus, when each of the click plate 13 and the friction plate 18 is subjected to a predetermined amount of deflection, a reaction force up to a near spring limit value is obtained with respect to each of the click plate 13 and the friction plate 18. For this reason, there are provided the shapes in which the holding force can be obtained efficiently.

In addition, in the hinge mechanism 1 according to the present Embodiment 1, the mountain-shaped holding projecting portion 11 is provided on the sliding surface 9 of the bracket 7, and the holding projecting portion 11 corresponds to the downslope tapered portion 11*b* which gently descends in an opening direction when the panel unit 53 is at the holding angle. Therefore, as illustrated in FIG. 9(*b*), a force F2 with a vector that moves the panel unit 53 in the opening direction is applied through abutment of the projecting portion 15 on the downslope tapered portion 11*b* with respect to the holding force F generated through elastic deformation of the click plate 13 and the friction plate 18. Thus, even if significant rattle noise is generated during viewing and the panel unit 53 resonates to be significantly swung, the panel unit 53 is adapted to be turned in the opening direction to thereby prevent a fall in the direction of the viewer 60.

From the above, according to Embodiment 1, the hinge mechanism 1 includes: the shaft 2 fixed to the panel unit 53; the bracket 7 fixed to the main body unit 52 to rotatably support the shaft 2, and provided with the recessed portion 10 in the sliding surface 9 at a position corresponding to the storing angle; the elastically deformable click plate 13 which turns integrally with the shaft 2 and which is provided with the projecting portion 15 to be brought into press contact with the sliding surface 9 of the bracket 7 to generate the sliding resistance, and fitted in and detached from the recessed portion 10; and the elastically deformable friction plate 18 which turns integrally with the shaft 2 and the click plate 13 and which is provided with the pressing piece 20 which applies the pressing force to the back side of the projecting portion 15 of the click plate 13, and it is configured such that the pressing piece 20 of the friction plate 18 does not abut on the back side of the projecting portion 15 of the click plate 13 at the storing angle at which the projecting portion 15 is fitted in the recessed portion 10 of the bracket 7, and abuts on the back side of the projecting portion 15 which has been elastically deformed to generate the pressing force at an angle other than the storing angle. Therefore, the sliding resistance can be generated by only the click plate 13 at the start of turning from the storing angle, and a larger sliding resistance can be generated by the pressing force of the friction plate 18 in addition to the sliding resistance of the click plate 13 during turning. Thus, it is possible to provide the hinge mechanism 1 with which a large sliding resistance is obtained during operation without excessively increasing the click operating force, and which provides a large holding force at an angle other than the storing angle. In addition, uneven wear of the projecting portion 15 can be suppressed because of the reduced click operating force.

In addition, according to Embodiment 1, there is provided a configuration in which the click plate 13 has a dent provided on the back side of the projecting portion 15 to accommodate the pressing piece 20 of the friction plate 18, and thus, the amount of projection of the pressing piece 20 can be reduced to cause no enlargement of the hinge mechanism 1. Thus, the small hinge mechanism 1 can be provided with achieving a large sliding resistance.

Incidentally, in Embodiment 1, there is described a configuration in which the dent is provided on the back side of the projecting portion 15; however, the back side of the projecting portion 15 maybe provided in a plane shape without forming the dent. In addition, in Embodiment 1, the gap 16 of a visually recognizable extent is provided between the back side of the projecting portion 15 and the pressing piece 20 at the storing angle; however, a gap of an extent not generating the pressing force may be provided, and a gap that barely or hardly abuts on the back side of the projecting portion 15 may be provided.

In addition, according to Embodiment 1, the spring constant of the friction plate 18 is larger than the spring constant of the click plate 13. Therefore, even if the amount of deflection of the friction plate 18 is smaller than the amount of deflection of the click plate 13 because of the provision of the gap 16, the amount of deflection of the friction plate 18 can be increased by changing the spring constant to thereby efficiently obtain the reaction force of not only the click plate 13 but also the friction plate 18.

In addition, according to Embodiment 1, the bracket 7 is configured to have the holding projecting portion 11 with which the projecting portion 15 of the click plate 13 is brought into press contact at a position of the sliding surface 9 corresponding to the holding angle. Therefore, the panel unit 53 can be held with a large sliding resistance in the use range of the panel unit 53, and can be turned with a relatively small sliding resistance at an angle other than the use.

In addition, according to Embodiment 1, the holding projecting portion 11 is configured to have the downslope tapered portion 11b which has a vertex on the storing angle side with respect to the holding angle range of the panel unit 53 and which slopes downward in the opening direction in which the panel unit 53 turns from the storing angle to the holding angle. Therefore, in a case where the hinge mechanism 1 is applied to the seat back monitor apparatus 51 in which the holding angle of the panel unit 53 is located above (in the direction opposite to the gravity direction) the hinge mechanism 1, the panel unit 53 turns in the opening direction from the holding angle to thus prevent a fall to the storing angle side even if continuous strong vibration is applied thereto, because of the provision of the downslope tapered portion 11b.

Incidentally, in Embodiment 1, the seat back monitor apparatus 51 installed on the back surface of the seat of the automobile is described as an example of the panel apparatus which uses the hinge mechanism 1; however, needless to say, it may be applicable to a mobile body such as railroad trains, ships, and airplanes, in addition to automobiles.

EMBODIMENT 2

Figure 11:
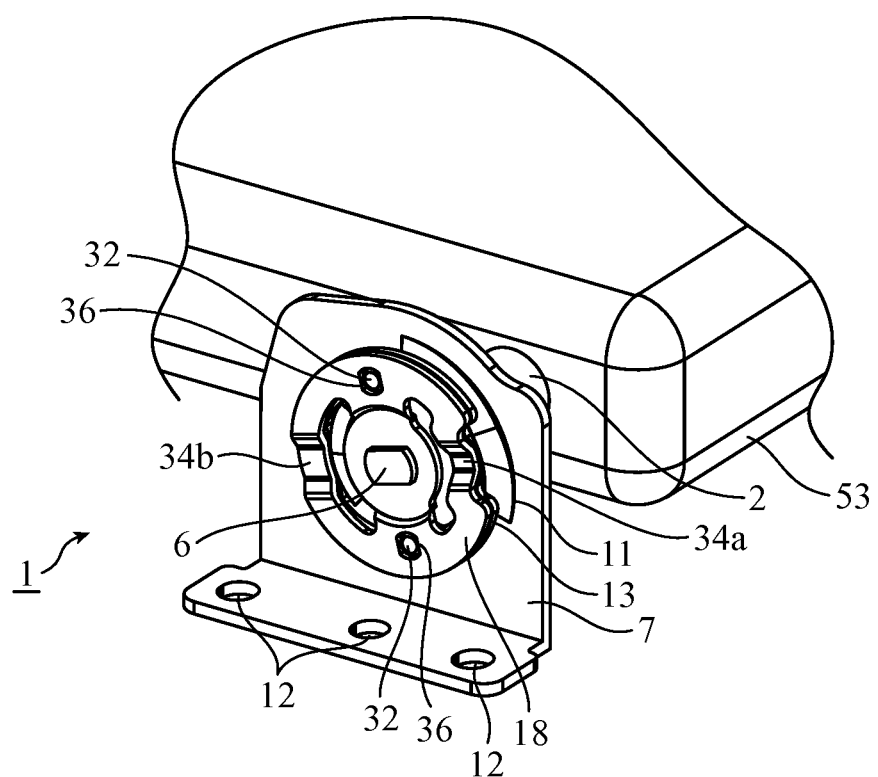
FIG. 11 is an appearance perspective view illustrating a configuration of a hinge mechanism according to Embodiment 2 of the present invention.
Figure 12:
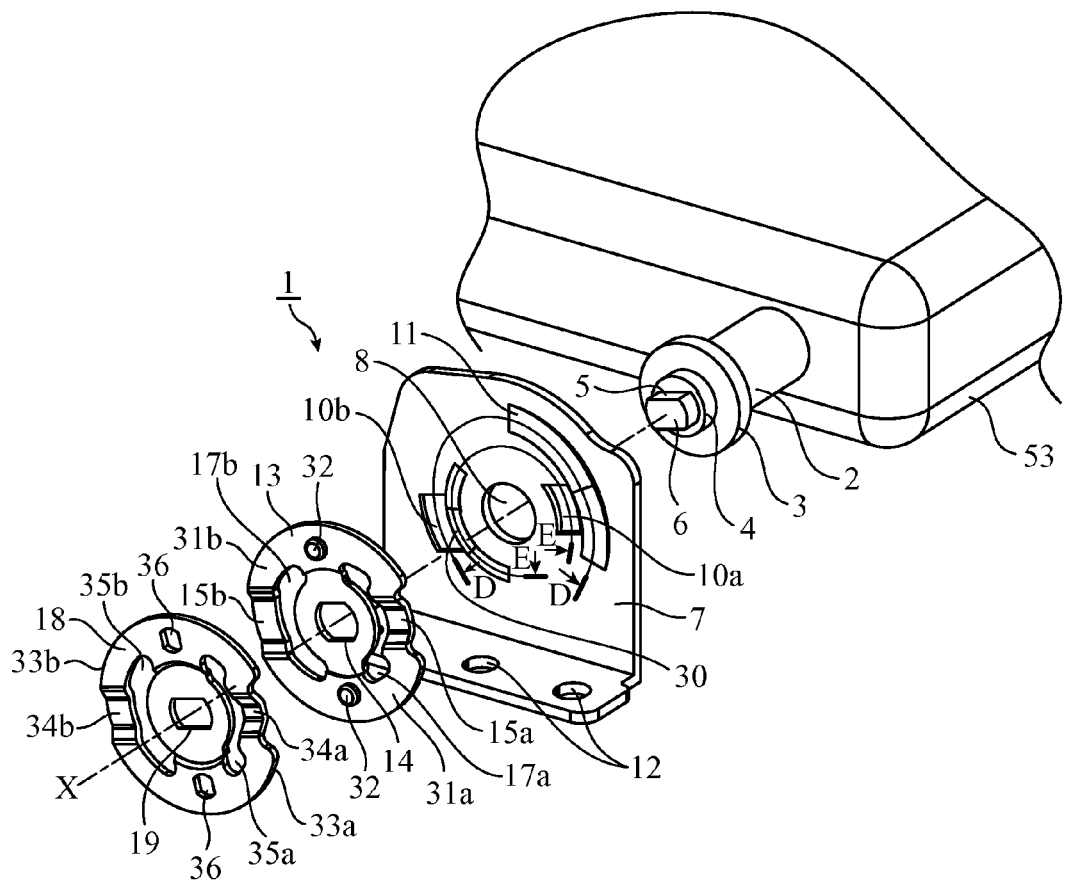
FIG. 12 is an exploded perspective view illustrating the configuration of the hinge mechanism according to Embodiment 2.
Figure 13:
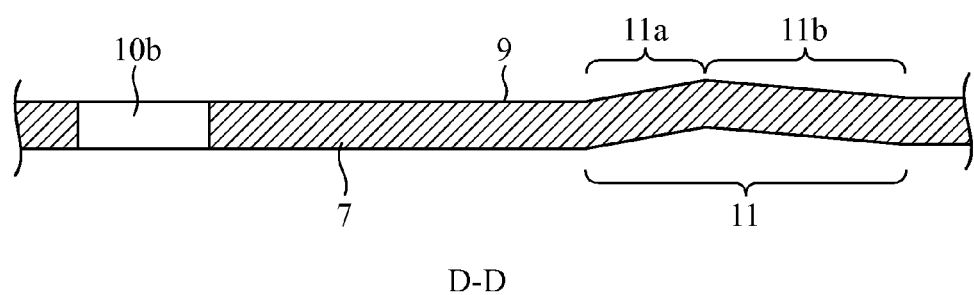
FIG. 13 is a sectional view of a bracket of the hinge mechanism according to Embodiment 2 taken along a line D-D of FIG. 12.
Figure 14:
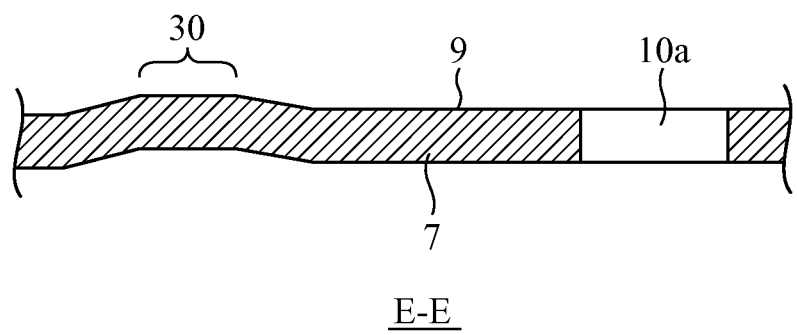
FIG. 14 is a sectional view of the bracket of the hinge mechanism according to Embodiment 2 taken along a line E-E of FIG. 12.
Figure 15:
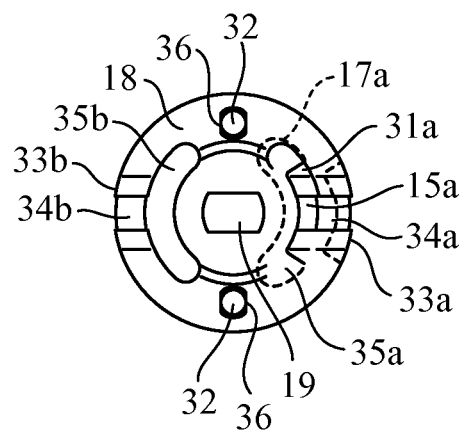
FIG. 15 is a front view illustrating a configuration of a click plate and a friction plate of the hinge mechanism according to Embodiment 2.

FIGS. 11 and 12 are an appearance perspective view and an exploded perspective view, respectively, illustrating a configuration of a hinge mechanism 1 according to the present Embodiment 2. FIG. 13 is a sectional view of a bracket 7 taken along a line D-D shown in FIG. 12, and FIG. 14 is a sectional view taken along a line E-E. FIG. 15 is a front view of a click plate 13 and a friction plate 18. Parts in FIGS. 11 to 15 that are the same as or correspond to those in FIGS. 1 to 9 are denoted by the same reference numerals, and these descriptions will be omitted. In addition, a case where the hinge mechanism 1 according to Embodiment 2 is applied to the seat back monitor apparatus 51 is described as an example, and FIGS. 4 and 5 are applied to the seat back monitor apparatus 51.

As illustrated in FIGS. 11 and 12, the hinge mechanism 1 according to Embodiment 2 includes a shaft 2 fixed to the panel unit 53, a bracket 7 fixed to the main body unit 52, a ring-shaped click plate 13 that generates a click action, and a ring-shaped friction plate 18 that applies a pressing force to the click plate 13, and the shaft 2 rotates about a rotational axis X integrally with the click plate 13 and the friction plate 18.

A recessed portion 10b and a holding projecting portion 11 are formed on a sliding surface 9 of the bracket 7 on the circumference about the rotational axis X. In addition, a recessed portion 10a and a holding projecting portion 30 are formed on the circumference about the rotational axis X and at positions further toward the rotational axis X (inner peripheral side) than the recessed portion 10b and the holding projecting portion 11. The holding projecting portion 30 is provided with a planar projecting portion, and a gently tapered surface is formed at a connection part between the sliding surface 9 and the holding projecting portion 30. A positional relationship between the recessed portions 10a and 10b is determined such that the recessed portions 10a and 10b are axially symmetrical about the rotational axis X and have different radii from each other. Likewise, a positional relationship between the holding projecting portions 11 and 30 is determined such that the holding projecting portions 11 and 30 are axially symmetrical about the rotational axis X, and that the holding projecting portion 11 is located on the radius of the recessed portion 10b, and that the holding projecting portion 30 is located on the radius of the recessed portion 10a.

The click plate 13 is protrusively provided with projecting portions 15a and 15b at positions that are axially symmetrical on ring arms 31a and 31b formed in a ring shape, respectively, and that have different radii from each other, and the back sides of the projecting portions 15a and 15b are dented. In addition, openings 17a and 17b are formed on the rotational axis X side of the projecting portions 15a and 15b, respectively, and the projecting portions 15a and 15b are made elastically deformable axially symmetrically. The projecting portion 15a is fitted into the recessed portion 10a of the bracket 7 when the panel unit 53 is located at the storing angle, and slides from the sliding surface 9 to the holding projecting portion 30 after getting onto a stepped portion of the recessed portion 10a as the panel unit 53 is turned. The other projecting portion 15b is fitted into the recessed portion 10b of the bracket 7 when the panel unit 53 is located at the storing angle, and slides from the sliding surface 9 to the holding projecting portion 11 after getting onto a stepped portion of the recessed portion 10b as the panel unit 53 is turned.

Further, positioning projections 32 for positioning between the click plate 13 and the friction plate 18 are protrusively provided at two places on a surface of the click plate 13 facing the friction plate 18.

The friction plate 18 is protrusively provided with pressing projecting portions (pressing portions) 34a and 34b at positions that are axially symmetrical on friction arms 33a and 33b formed in a ring shape, respectively, and have different radii from each other. In addition, openings 35a and 35b are formed on the rotational axis X side of the pressing projecting portions 34a and 34b, respectively, and thus, the friction arms 33a and 33b formed with the pressing projecting portions 34a and 34b are made elastically deformable, respectively. The friction plate 18 and the click plate 13 turn integrally with the shaft 2 with the pressing projecting portion 34a fitted into the dent on the back side of the projecting portion 15a and with the pressing projecting portion 34b fitted into the dent on the back side of the projecting portion 15b.

In addition, the positioning projections 32 at the two places of the click plate 13 are fitted in positioning holes 36 at two places formed in the friction plate 18. Since the click plate 13 rotates synchronously with a small diameter portion 6 of the shaft 2 fitted in the shaft fitting hole 14, backlash may be caused if there is a gap between the shaft fitting hole 14 and the small diameter portion 6; however, when the positioning projections 32 are fitted in the positioning holes 36, the click plate 13 is fixed to the friction plate 18 caulked to the shaft 2, thus preventing the backlash described above.

As described above, the projecting portion 15a and the recessed portion 10a are formed on the inner peripheral side of the sliding surface 9, and the projecting portion 15b and the recessed portion 10b are formed on the outer peripheral side of the sliding surface 9 to be shifted from each other, and thus, the shaft 2 can rotate by 180° or more from the storing angle to a maximum angle in a holding angle range.

In addition, gaps 16a and 16b (illustrated in FIGS. 16(b) and 16(c) to be described later) are provided between the back side of the projecting portion 15a and the pressing projecting portion 34a, and between the back side of the projecting portion 15b and the pressing projecting portion 34b, respectively, with the click plate 13 and the friction plate 18 not elastically deformed. The gaps 16a and 16b are adapted by forming the friction arms 33a and 33b, respectively, by bending the outer peripheral portions of the friction plate 18 as illustrated in FIG. 12, for example.

In addition, the ring arms 31a and 31b and the friction arms 33a and 33b are shaped differently such that the spring constant of the friction plate 18 is larger than the spring constant of the click plate 13. Consequently, even if the amount of deflection of the click plate 13 is increased and the amount of deflection of the friction plate 18 is reduced as a result of providing the gaps 16a and 16b, a reaction force up to a near spring limit value is obtained from each of the click plate 13 and the friction plate 18 by changing the spring constant. In addition, the projecting portions 15a and 15b of the click plate 13 are disposed axially symmetrically, the friction arms 33a and 33b of the friction plate 18 are similarly disposed axially symmetrically, and it is thus configured such that the click plate 13 and the friction plate 18 are deflected axially symmetrically; therefore, the direction of the vector of forces due to the reaction forces of the click plate 13 and the friction plate 18 matches the axial direction of the shaft 2; consequently, the caulked portion is subjected to balanced forces, and not easily loosened.

Next, an operation of the hinge mechanism 1 will be described with reference to FIGS. 16 to 18 taking an example in which the hinge mechanisms 1 are incorporated in the in-vehicle seat back monitor apparatus 51.

FIG. 16(a) is a perspective view of the hinge mechanism 1 with the panel unit 53 at the storing angle, FIG. 16(b) is a sectional view taken along a line F-F, and FIG. 16(c) is a sectional view taken along a line G-G. FIG. 17(a) is a perspective view of the hinge mechanism 1 with the panel unit 53 at an arbitrary viewing angle within the holding angle range, FIG. 17(b) is a sectional view taken along a line H-H, and FIG. 17(c) is a sectional view taken along a line I-I.

Figure 18:
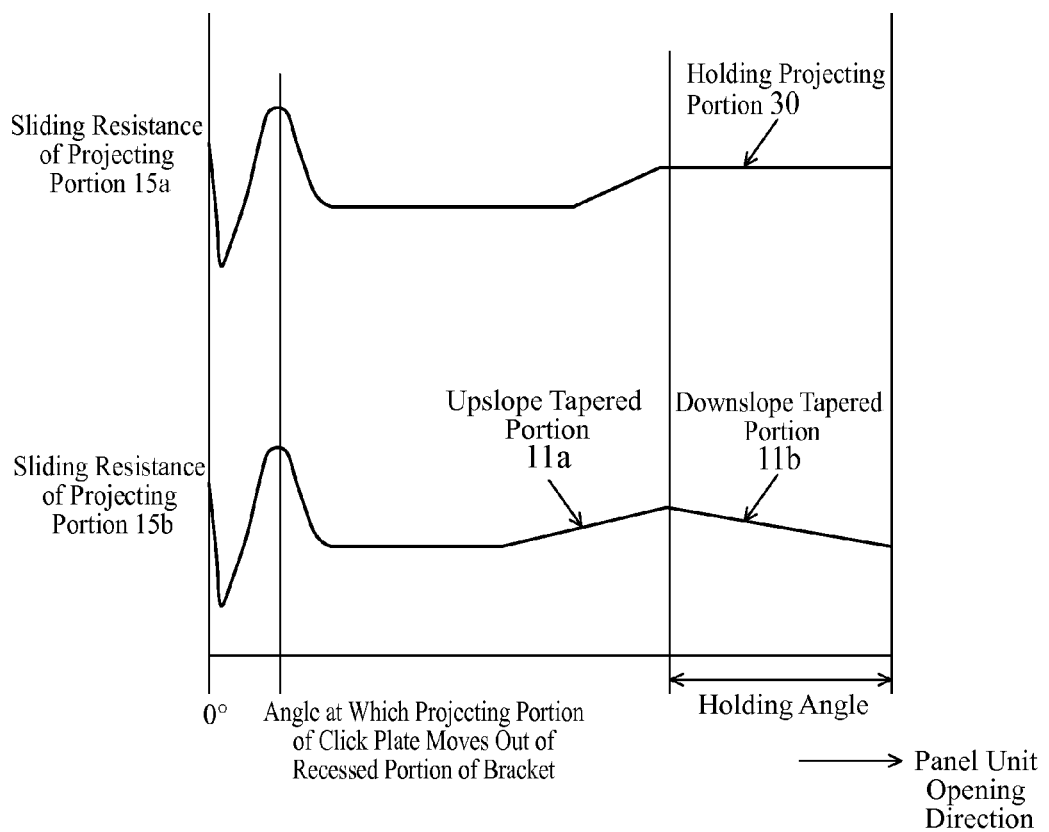
FIG. 18 is a graph illustrating a relationship between a turning angle of a panel unit and a sliding resistance of the hinge mechanism in Embodiment 2.

FIG. 18 is a graph indicating a relationship between a turning angle of the panel unit 53 and a sliding resistance of the projecting portions 15a and 15b of the click plate 13. In the graph, the vertical axis indicates the sliding resistance of the projecting portions 15a and 15b, and the horizontal axis indicates the turning angle of the panel unit 53.

Figure 16:
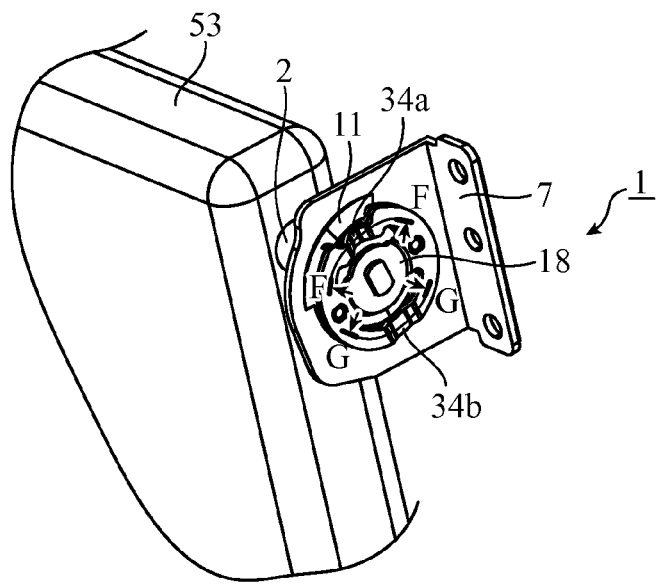
FIG. 16 is a diagram illustrating an operation of the hinge mechanism according to Embodiment 2, illustrating the panel unit at a storing angle.
Figure 16:
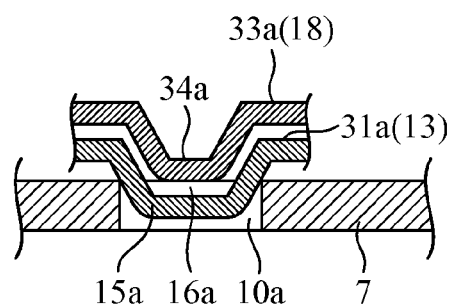
Figure 16:
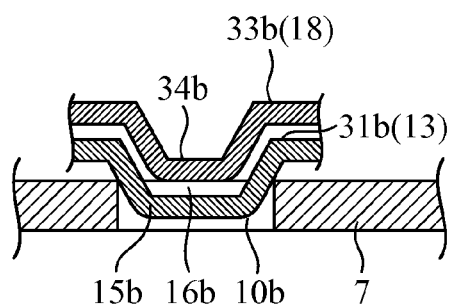
Figure 17:
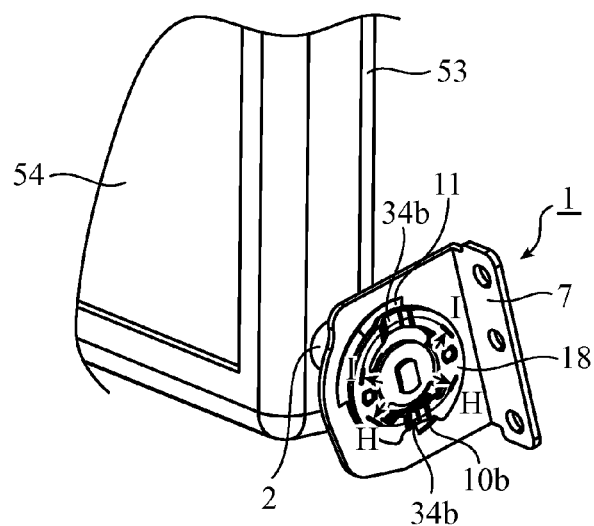
FIG. 17 is a diagram illustrating the operation of the hinge mechanism according to Embodiment 2, illustrating the panel unit at a holding angle (viewing angle).
Figure 17:
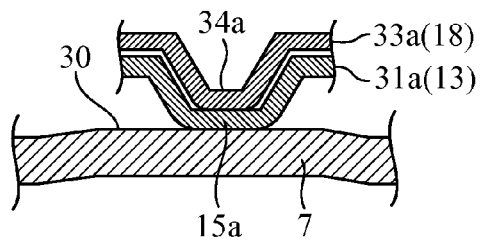
Figure 17:
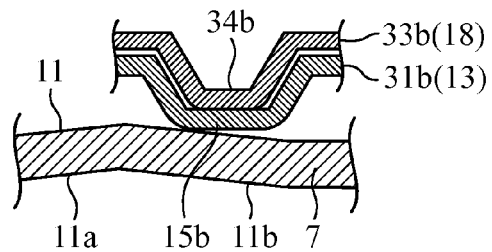

As illustrated in FIG. 4, the panel unit 53 of the seat back monitor apparatus 51 is accommodated in a closed state within the main body unit 52, and at this time, the hinge mechanism 1 is in a state illustrated in FIG. 16. At the storing angle, the projecting portions 15a and 15b of the click plate 13 of the hinge mechanism 1 are in a state fitted into the recessed portions 10a and 10b of the bracket 7, and the panel unit 53 is held by fitting between the projecting portions 15a and 15b and the recessed portions 10a and 10b. In this state, as illustrated in FIGS. 16(b) and 16(c), the pressing projecting portions 34a and 34b of the friction plate 18 are fitted into the dents on the back sides of the projecting portions 15a and 15b of the click plate 13, but do not abut on the projecting portions 15a and 15b, thus generating the gaps 16a and 16b.

Next, when desiring to see a video, a viewer 60 manually turns the panel unit 53 to a state of FIG. 5. Then, the projecting portions 15a and 15b of the click plate 13 move out of the recessed portions 10a and 10b of the bracket 7. At this time, the ring arms 31a and 31b of the click plate 13 are elastically deformed to increase an operating force for turning the panel unit 53. In addition, the back sides of the projecting portions 15a and 15b, and the pressing projecting portions 34a and 34b of the friction plate 18 abut on each other, before the projecting portions 15a and 15b move out of the recessed portions 10a and 10b, and elastic deformation of the ring arms 31a and 31b displaces the projecting portions 15a and 15b to lift the pressing projecting portions 34a and 34b, which further elastically deforms the friction arms 33a and 33b. Therefore, the sliding resistance is obtained from the reaction forces of the click plate 13 and the friction plate 18 after the abutment, and the operating force becomes maximum immediately before the projecting portions 15a and 15b move out of the recessed portions 10a and 10b as illustrated in FIG. 18.

Then, when the panel unit 53 is turned to the viewing angle as illustrated in FIG. 5, the projecting portion 15a of the click plate 13 abuts on the holding projecting portion 30 as illustrated in FIG. 17(b), which results in a state that the projecting portion 15b abuts on the downslope tapered portion 11b of the holding projecting portion 11 as illustrated in FIG. 17(c). Therefore, as illustrated in FIG. 18, the sliding resistance generated by the abutment between the projecting portion 15a and the downslope tapered portion 11b is reduced as the panel unit 53 is turned in the opening direction in the holding angle range of the panel unit 53 (which corresponds to the range of the downslope tapered portion 11b); however, the sliding resistance generated by the abutment between the projecting portion 15a and the holding projecting portion 30 becomes constant irrespective of the turning angle in the holding angle range of the panel unit 53. Thus, the operating force required to turn the panel unit 53 is reduced to a small degree relative to the turning angle of the panel unit 53 in the holding angle range, and a large holding force is obtained even in the small hinge mechanism 1.

In addition, as illustrated in FIG. 18, the angle switching from the upslope tapered portion 11a to the downslope tapered portion 11b of the holding projecting portion 11, and the starting angle of the projected plane of the holding projecting portion 30 are slightly shifted from each other; thus, fluctuations in operating force required to turn the panel unit 53 are reduced, and it is thus configured such that the panel unit 53 can be smoothly turned into the holding angle range. It should be noted, however, that the positional relationship between the angle switching to the downslope tapered portion 11b and the starting angle of the projected surface of the holding projecting portion 30 is not limited thereto.

From the above, according to Embodiment 2, the bracket 7 has the recessed portions 10a and 10b provided in the sliding surface 9 and positioned axially symmetrically about the rotational axis X of the shaft 2 at different radial distances from the rotational axis X; the click plate 13 has the projecting portions 15a and 15b to be brought into press contact with the sliding surface 9 of the bracket 7 to generate the sliding resistance, and to be fitted in and detached from the recessed portions 10a and 10b, respectively, the projecting portions 15a and 15b being positioned axially symmetrically about the rotational axis X of the shaft 2 at different radial distances from the rotational axis X; and the friction plate 18 has the pressing projecting portions 34a and 34b which apply a pressing force to the back side of the projecting portions 15a and 15b, respectively, of the click plate 13, the pressing projecting portions 34a and 34b being positioned axially symmetrically about the rotational axis X of the shaft 2 at different radial distances from the rotational axis X. Therefore, it is possible to configure the hinge mechanism 1 which turns by 180° or more. In addition, it is possible to provide the hinge mechanism 1 with which a large sliding resistance is obtained during operation without excessively increasing the click operating force as in Embodiment 1 described above, and which provides a large holding force at an angle other than the storing angle.

In addition, according to Embodiment 2, the bracket 7 has the holding projecting portion 11 provided on the sliding surface 9 at a position corresponding to the holding angle to be brought into press contact with the projecting portion 15b of the click plate 13, and the holding projecting portion 30 provided on the sliding surface 9 to be brought into press contact with the projecting portion 15a of the click plate 13, the holding projecting portion 30 being positioned axially symmetrically with respect to the holding projecting portion 11 about the rotational axis X and being different in radial distance from the rotational axis X from the holding projecting portion 11, and it is configured such that the holding projecting portion 11 is configured to have the downslope tapered portion 11b which slopes downward in the opening direction in which the panel unit 53 turns from the storing angle to the holding angle in the holding angle range of the panel unit 53. Therefore, in a case where the hinge mechanism 1 is applied to the seat back monitor apparatus 51 in which the holding angle of the panel unit 53 is located above (in the direction opposite to the gravity direction) the hinge mechanism 1, the panel unit 53 turns in the opening direction from the holding angle to thus prevent a fall to the storing angle side even if continuous strong vibration is applied, because of the provision of the downslope tapered portion 11b. In addition, the holding projecting portion 30 has a top in a planar projected shape, and therefore can keep the holding force. Thus, it is possible to provide the hinge mechanism 1 which the panel unit 53 hardly falls because of vibration while keeping the holding force.

Embodiment 3

Figure 19:
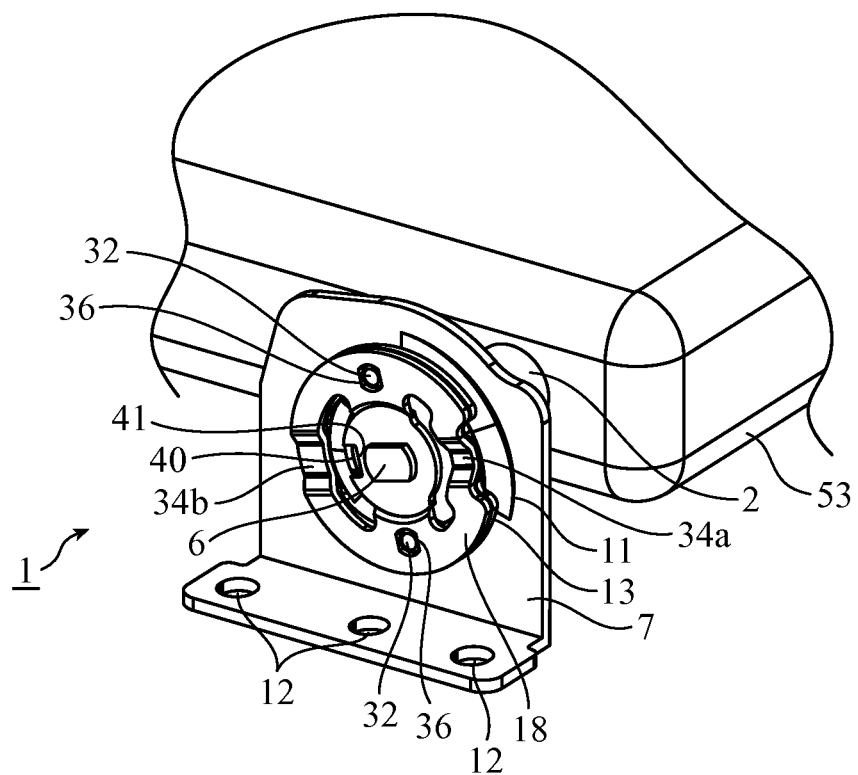
FIG. 19 is an appearance perspective view illustrating a configuration of a hinge mechanism according to Embodiment 3 of the present invention.
Figure 20:
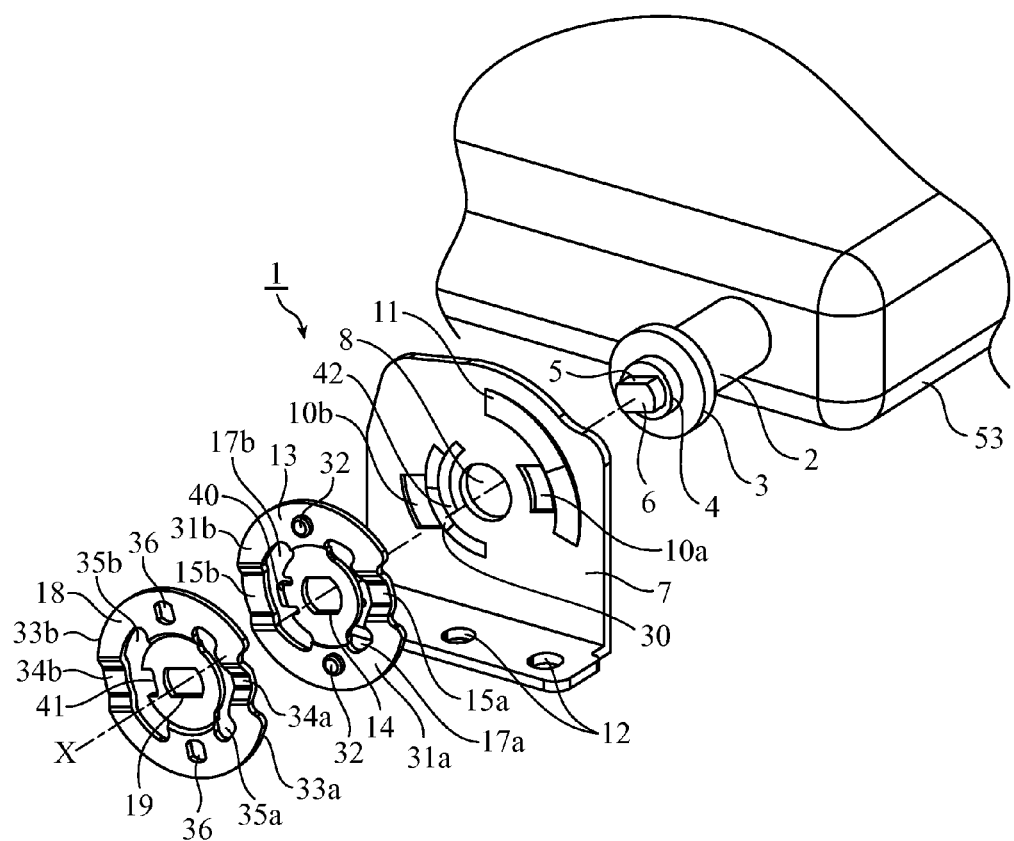
FIG. 20 is an exploded perspective view illustrating the configuration of the hinge mechanism according to Embodiment 3.

FIGS. 19 and 20 are an appearance perspective view and an exploded perspective view, respectively, illustrating a configuration of a hinge mechanism 1 according to Embodiment 3. Parts in FIGS. 19 and 20 that are the same as or correspond to those in FIGS. 11 to 17 are denoted by the same reference numerals, and these descriptions will be omitted. In addition, a case where the hinge mechanism 1 according to Embodiment 3 is applied to the seat back monitor apparatus 51 is described as an example, and FIGS. 4 and 5 are applied to the seat back monitor apparatus 51.

As illustrated in FIGS. 19 and 20, a sliding projecting portion 40 that presses and slides on the bracket 7 is provided at a position further toward the inner peripheral side than the ring arm 31b. Therefore, a force for holding the panel unit 53 can be increased by a sliding resistance generated at the time when the sliding projecting portion 40 slides on the sliding surface 9 of the bracket 7 without increasing the size of the hinge mechanism 1 or increasing the number of parts. Since the sliding projecting portion 40 and ring arms 31a and 31b are separated from each other, the sliding projecting portion 40 does not affect elastic deformation of the ring arms 31a and 31b.

Meanwhile, an escape hole 41 for a case where the sliding projecting portion 40 abuts on the sliding surface 9 of the bracket 7 to be elastically deformed is formed in a portion of the friction plate 18 facing the sliding projecting portion 40.

In addition, an escape hole 42 into which the sliding projecting portion 40 is to be fitted is recessed in a part of the sliding surface 9 of the bracket 7. Consequently, it is possible to increase the holding force for holding the panel unit 53 for only an arbitrary turning angle range by increasing the sliding resistance at the time when the sliding projecting portion 40 slides on the sliding surface 9 and reducing the sliding resistance at the time when the sliding projecting portion 40 is fitted into the escape hole 42.

Figure 21:
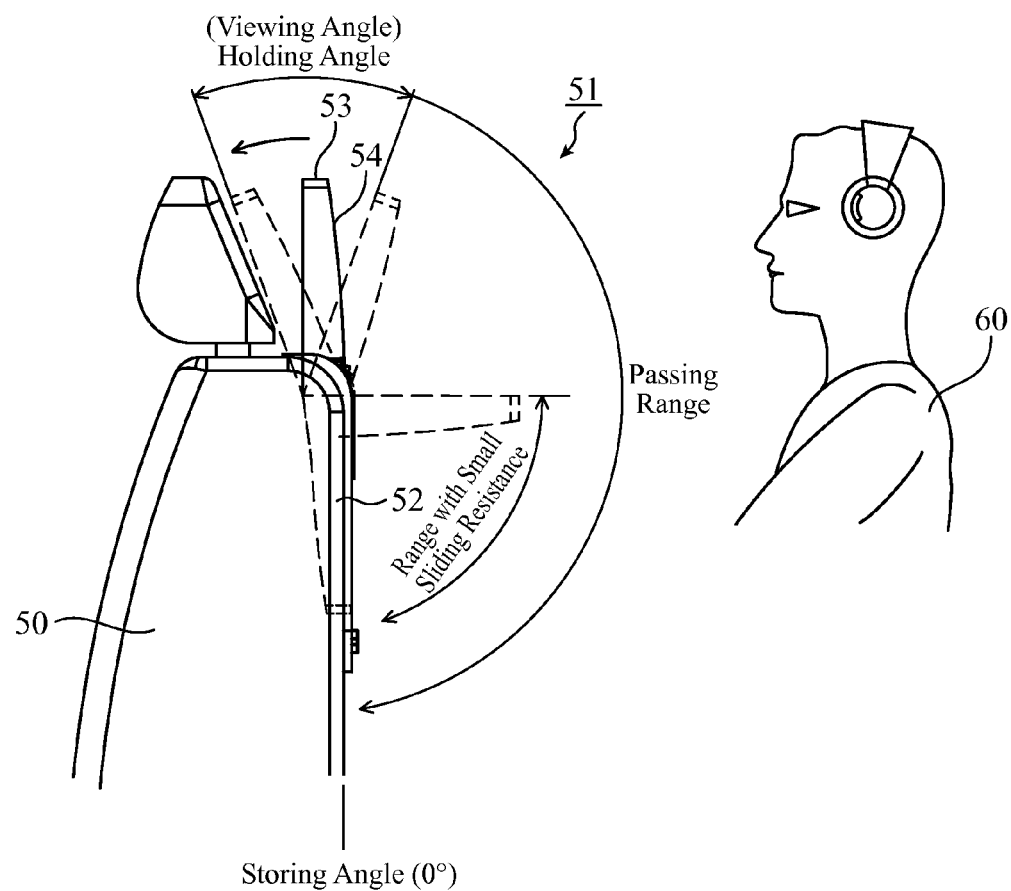
FIG. 21 is a diagram illustrating a positional relationship between a turning angle of a panel unit and a viewer in Embodiment 3.
Figure 22:
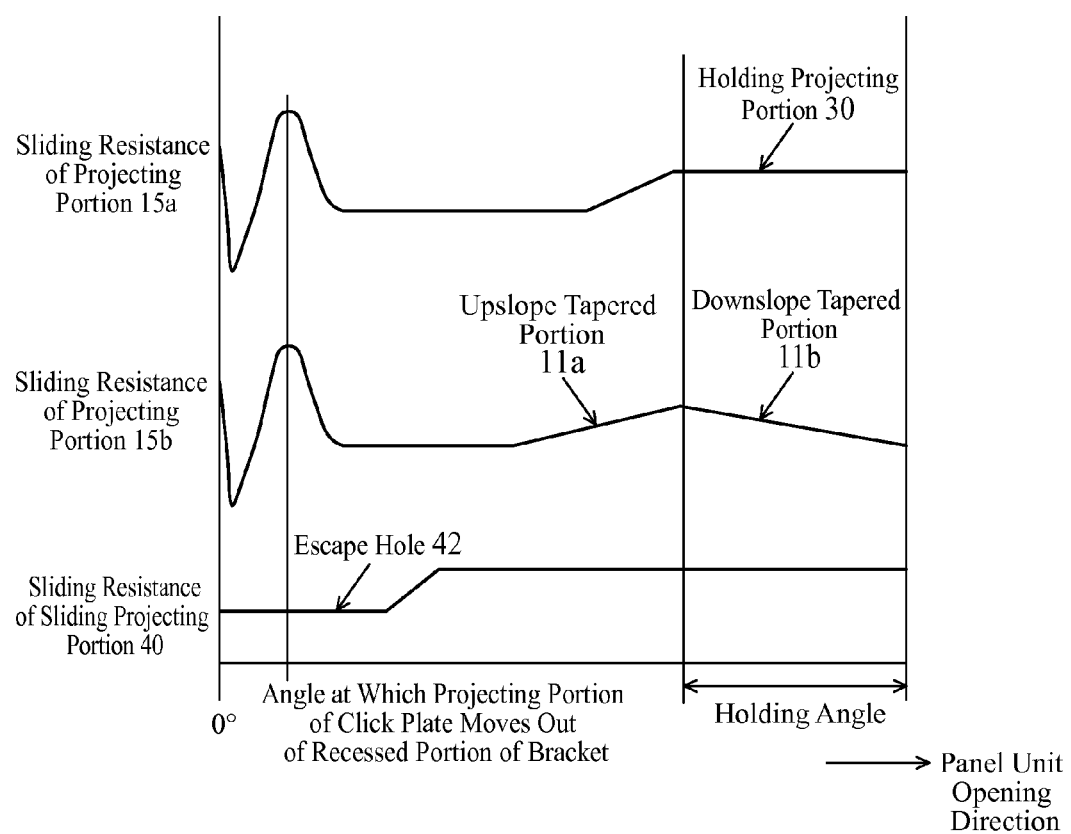
FIG. 22 is a graph illustrating a relationship between the turning angle of the panel unit and the sliding resistance of the hinge mechanism in Embodiment 3.

FIG. 21 is a diagram illustrating the positional relationship between the turning angle of the panel unit 53 and a viewer 60. FIG. 22 is a graph indicating relationships between the turning angle of the panel unit 53 and the respective sliding resistances of projecting portions 15a and 15b and the sliding projecting portion 40. In the graph, the vertical axis indicates the sliding resistance, and the horizontal axis indicates the turning angle of the panel unit 53.

In a case where the hinge mechanism 1 is applied to the seat back monitor apparatus 51, for example, the escape hole 42 is formed in a portion corresponding to turning angles of the panel unit 53 turnable from a storing angle 0° to about 90° (FIG. 20). Consequently, although high turning torque is required to lift the panel unit against the gravity direction while the panel unit 53 turns by 90° from the storing state as illustrated in FIGS. 21 and 22, the sliding resistance is reduced since the sliding projecting portion 40 is fitted into the escape hole 42 during movement. When the panel unit 53 turns by 90° or more, the sliding resistance is increased since the sliding projecting portion 40 moves out of the escape hole 42 and slides over the sliding surface 9. Therefore, the sliding resistance can be increased in a necessary place (holding angle range) without excessively increasing the holding force for the panel unit 53, and the seat back monitor apparatus 51 with high operability even if it is small can be achieved.

From the above, according to Embodiment 3, the bracket 7 is configured to have the ring arms 31a and 31b on which the projecting portions 15a and 15b of the sliding surface 9 are formed, and the sliding projecting portion 40 provided further toward the inner side than the ring arms 31a and 31b to be brought into press contact with the sliding surface 9 of the bracket 7 to generate the sliding resistance. Therefore, it is possible to provide the hinge mechanism 1 which generates a larger sliding resistance due to the sliding resistance of the sliding projecting portion 40 without increasing the size of the hinge mechanism 1 or increasing the number of parts.

According to Embodiment 3, in addition, the bracket 7 is configured to have the escape hole 42 which the sliding projecting portion 40 of the click plate 13 is fitted in and detached from, the escape hole 42 being provided in the sliding surface 9 at a position corresponding to the storing angle, and further toward the inner side than the recessed portions 10a and 10b. Therefore, the sliding resistance can be generated by only the click plate 13 at the start of turning from the storing angle, at the time when large turning torque is required to lift the panel unit 53 against the gravity direction, and the larger sliding resistance can be generated by the pressing force of the friction plate 18 and the sliding resistance of the sliding projecting portion 40 in addition to the sliding resistance of the click plate 13 during turning. Thus, it is possible to provide the hinge mechanism 1 with which the larger sliding resistance is obtained during operation without excessively increasing the click operating force, and which provides a large holding force at an angle other than the storing angle.

Additionally, in the illustrated example, the escape hole 41 is formed in the friction plate 18. However, a diaphragm may be formed in the caulking direction.

In addition to the aforementioned description, the present invention maybe subjected to a free combination of the embodiments, deformation of an arbitrary component of each embodiment, or omission of an arbitrary component of each embodiment within the scope of the invention.

INDUSTRIAL APPLICABILITY

As has been described above, the hinge apparatus according to the present invention is adapted to provide the holding force at an arbitrary angle by reducing the sliding resistance at the start of turning and increasing the sliding resistance during turning, and thus, it is suitable for use in the panel apparatus such as the seat back monitor apparatus installed on the back surface of the seat and used as opened in the direction opposite to the gravity direction.

DESCRIPTION OF REFERENCE NUMERALS and SIGNS

1: hinge mechanism
2: shaft (support shaft)
3: flange portion
4: medium diameter portion
5: plane cut portion
6: small diameter portion
7: bracket (fixed portion)
8: rotational shaft hole
9: sliding surface
10, 10a, 10b: recessed portion
11, 30: holding projecting portion
11a: upslope tapered portion
11b: downslope tapered portion
12: screw hole
13: click plate
14: shaft fitting hole
15, 15a, 15b: projecting portion
16, 16a, 16b: gap
17, 17a, 17b: opening
18: friction plate
19: caulking hole
20: pressing piece (pressing portion)
31a, 31b: ring arm
32: positioning projection
33a, 33b: friction arm
34a, 34b: pressing projecting portion (pressing portion)
35a, 35b: opening
36: positioning hole
40: sliding projecting portion
41, 42: escape hole
50: seat
51: seat back monitor apparatus
52: main body unit (fixed member)
53: panel unit (turning member)
54: monitor screen
55: panel holding recessed portion
60: viewer.

The invention claimed is:

1. A hinge mechanism that turnably couples a fixed member and a turning member to each other, and that holds the turning member at a predetermined first angle with respect to the fixed member, and that turns the turning member from the first angle to hold the turning member at an arbitrary second angle,
the hinge mechanism comprising:
a support shaft fixed to the turning member;
a fixed portion fixed to the fixed member to rotatably support the support shaft, the fixed portion including a recessed portion provided in one side surface at a position corresponding to the first angle;
an elastically deformable click plate that turns integrally with the support shaft, and that includes a projecting portion to be brought into press contact with the one side surface of the fixed portion to generate a sliding resistance, and fitted in and detached from the recessed portion; and
an elastically deformable friction plate that turns integrally with the support shaft and the click plate, and that is provided with a pressing portion that applies a pressing force to a back side of the projecting portion of the click plate, wherein
the pressing portion of the friction plate does not abut on the back side of the projecting portion at the first angle at which the projecting portion of the click plate is fitted into the recessed portion of the fixed portion, and abuts on the back side of the projecting portion which has been elastically deformed to generate the pressing force at an angle other than the first angle.

2. The hinge mechanism according to claim 1, wherein the click plate has a dent provided on the back side of the projecting portion to accommodate the pressing portion of the friction plate.

3. The hinge mechanism according to claim 1, wherein a spring constant of the friction plate is larger than a spring constant of the click plate.

4. The hinge mechanism according to claim 1, wherein the fixed portion has a holding projecting portion provided on the one side surface at a position corresponding to the second angle to be brought into press contact with the projecting portion of the click plate.

5. The hinge mechanism according to claim 4, wherein in a case where the turning member is positioned further toward a gravity direction than the support shaft at the first angle, and positioned further toward a direction opposite to the gravity direction than the support shaft at the second angle, the holding projecting portion has a tapered portion that slopes downward in a direction in which the turning member turns from the first angle to the second angle in a range of the second angle.

6. The hinge mechanism according to claim 1, wherein the fixed portion has a second recessed portion provided in the one side surface, the second recessed portion being positioned axially symmetrically with respect to the recessed portion about the support shaft and being different in radial distance from the support shaft from the recessed portion;

the click plate has a second projecting portion to be brought into press contact with the one side surface of the fixed portion to generate a sliding resistance, and fitted in and detached from the second recessed portion, the second projecting portion being positioned axially symmetrically with respect to the projecting portion about the support shaft and being different in radial distance from the support shaft from the projecting portion; and the friction plate has a second pressing portion that applies a pressing force to the back side of the second projecting portion of the click plate, the second pressing portion being positioned axially symmetrically with respect to the pressing portion about the support shaft and being different in radial distance from the support shaft from the pressing portion.

7. The hinge mechanism according to claim 6, wherein the fixed portion has a holding projecting portion provided on the one side surface at a position corresponding to the second angle to be brought into press contact with the projecting portion of the click plate, and a second holding projecting portion provided on the one side surface to be brought into press contact with the second projecting portion of the click plate, the second holding projecting portion being positioned axially symmetrically with respect to the holding projecting portion about the support shaft and being different in radial distance from the support shaft from the holding projecting portion; and one of the holding projecting portion and the second holding projecting portion has a tapered portion that slopes downward in a direction in which the turning member turns from the first angle to the second angle in a range of the second angle.

8. The hinge mechanism according to claim 6, wherein the click plate has ring-shaped arms on which the projecting portion and the second projecting portion are formed, and a sliding projecting portion provided further toward an inner side than the arms to be brought into press contact with the one side surface of the fixed portion to generate a sliding resistance.

9. The hinge mechanism according to claim 8, wherein the fixed portion has an escape hole which the sliding projecting portion of the click plate is fitted in and detached from, the escape hole being provided in the one side surface at a position corresponding to the first angle and further toward an inner side than the recessed portion and the second recessed portion.

10. A panel apparatus that uses a hinge mechanism to turnably couple a main body unit and a panel unit having a monitor screen to each other, the monitor screen being held at a first angle at which the monitor screen is closed to the main body unit side when not in use, and held at an arbitrary second angle at which the panel unit is turned from the first angle to open the monitor screen when in use, wherein the hinge mechanism includes:

a support shaft fixed to the panel unit;

a fixed portion fixed to the main body unit to rotatably support the support shaft, the fixed portion including a recessed portion provided in one side surface at a position corresponding to the first angle;

an elastically deformable click plate that turns integrally with the support shaft, and that includes a projecting portion to be brought into press contact with the one side surface of the fixed portion to generate a sliding resistance, and fitted in and detached from the recessed portion; and an elastically deformable friction plate that turns integrally with the support shaft and the click plate, and that is provided with a pressing portion that applies a pressing force to a back side of the projecting portion of the click plate, and wherein the pressing portion of the friction plate does not abut on the back side of the projecting portion at the first angle at which the projecting portion of the click plate is fitted into the recessed portion of the fixed portion, and abuts on the back side of the projecting portion which has been elastically deformed to generate the pressing force at an angle other than the first angle.

* * * * *